(12) United States Patent
Sharon

(10) Patent No.: US 8,988,942 B2
(45) Date of Patent: Mar. 24, 2015

(54) METHODS FOR EXTENDING THE EFFECTIVE VOLTAGE WINDOW OF A MEMORY CELL

(75) Inventor: Eran Sharon, Rishon Lezion (IL)

(73) Assignee: Sandisk Technologies Inc., Plano, TX (US)

( * ) Notice: Subject to any disclaimer, the term of this patent is extended or adjusted under 35 U.S.C. 154(b) by 192 days.

(21) Appl. No.: 13/540,351

(22) Filed: Jul. 2, 2012

(65) Prior Publication Data

US 2014/0003152 A1    Jan. 2, 2014

(51) Int. Cl.
| G11C 16/04 | (2006.01) |
|---|---|
| G11C 11/56 | (2006.01) |
| G11C 16/26 | (2006.01) |

(52) U.S. Cl.
CPC ............ *G11C 16/26* (2013.01); *G11C 11/5628* (2013.01); *G11C 11/5642* (2013.01)
USPC .............. 365/185.18; 365/185.2; 365/185.17; 365/185.03

(58) Field of Classification Search
USPC .............. 365/185.18, 185.22, 185.17, 185.03
See application file for complete search history.

(56) References Cited

U.S. PATENT DOCUMENTS

| 7,269,069 | B2 | 9/2007 | Cernea | |
|---|---|---|---|---|
| 7,400,535 | B2 | 7/2008 | Li | |
| 7,839,687 | B2 | 11/2010 | Dutta | |
| 8,089,815 | B2 | 1/2012 | Li | |
| 8,169,822 | B2 | 5/2012 | Dutta | |
| 2007/0133297 | A1* | 6/2007 | Cernea ..................... | 365/185.22 |
| 2009/0129153 | A1 | 5/2009 | Sarin | |
| 2010/0074026 | A1 | 3/2010 | Kang | |
| 2010/0097861 | A1* | 4/2010 | Dutta et al. .............. | 365/185.17 |
| 2011/0197015 | A1 | 8/2011 | Chae | |
| 2012/0134208 | A1 | 5/2012 | Lee | |
| 2012/0163085 | A1* | 6/2012 | Alrod et al. .............. | 365/185.18 |
| 2014/0269066 | A1 | 9/2014 | Sharon | |

OTHER PUBLICATIONS

PCT International Search Report dated Oct. 9, 2013, PCT Patent Application No. PCT/US2013/044848.
PCT Written Opinion of the International Searching Authority dated Oct. 9, 2013, PCT Patent Application No. PCT/US2013/044848.
Office Action dated Sep. 3, 2014, U.S. Appl. No. 14/289,763.
Response to Office Action dated Sep. 30, 2014, U.S. Appl. No. 14/289,763.
Notice of Allowance dated Dec. 23, 2014, U.S. Appl. No. 14/289,763.

\* cited by examiner

*Primary Examiner* — Richard Elms
*Assistant Examiner* — Mohammed A Bashar
(74) *Attorney, Agent, or Firm* — Vierra Magen Marcus LLP

(57) ABSTRACT

Methods for operating a non-volatile storage system in which cross-coupling effects are utilized to extend the effective threshold voltage window of a memory cell and to embed additional information within the extended threshold voltage window are described. In some cases, additional information may be embedded within a memory cell storing the highest programming state if the memory cell is in a high boosting environment by splitting the highest programming state into two substates and programming the memory cell to one of the two substates based on the additional information. A memory cell may be in a high boosting environment if its neighboring memory cells are in a high programmed state. Additional information may also be embedded within a memory cell storing the lowest programming state if the memory cell is in a low boosting environment. The additional information may include error correction information.

26 Claims, 16 Drawing Sheets

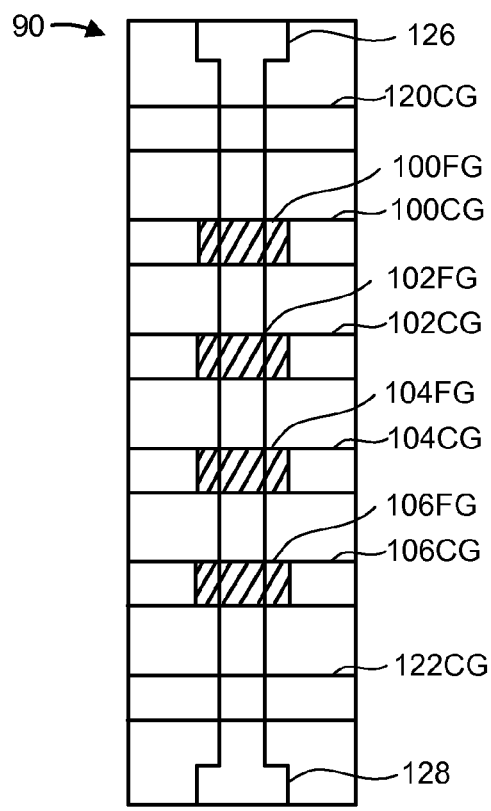
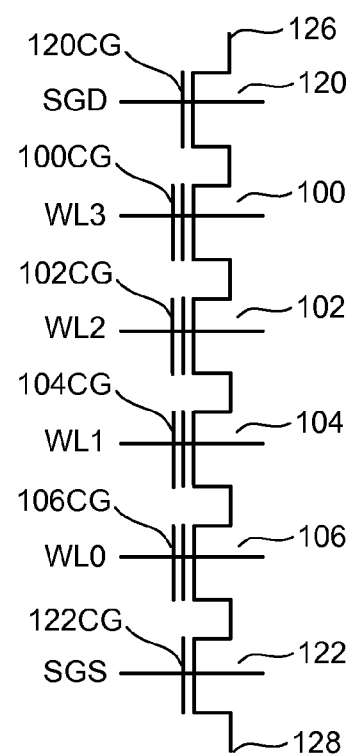
FIG. 1          FIG. 2

(Prior Art)

First programming pass

Second programming pass

METHODS FOR EXTENDING THE EFFECTIVE VOLTAGE WINDOW OF A MEMORY CELL

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim tunneling or hot-electron injection. The ability to adjust the threshold voltage allows a floating-gate transistor to act as a data storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates are referred to as a NAND string. In recent years, NAND flash memory has been scaled (faster than Moore's law) in order to reduce cost per bit. However, as process geometries shrink, many design and process challenges are presented. These challenges include reduced charge storage capacity per memory cell and increased floating gate to floating gate coupling between adjacent memory cells. Both the reduced charge storage capacity per memory cell and the increased floating gate to floating gate coupling between memory cells reduce the effective threshold voltage window in which a memory cell may be programmed reliably.

BRIEF DESCRIPTION OF THE DRAWINGS

FIG. 1 depicts one embodiment of a NAND string.

FIG. 2 depicts an equivalent circuit diagram for the NAND string of FIG. 1.

DETAILED DESCRIPTION

Figure 3:
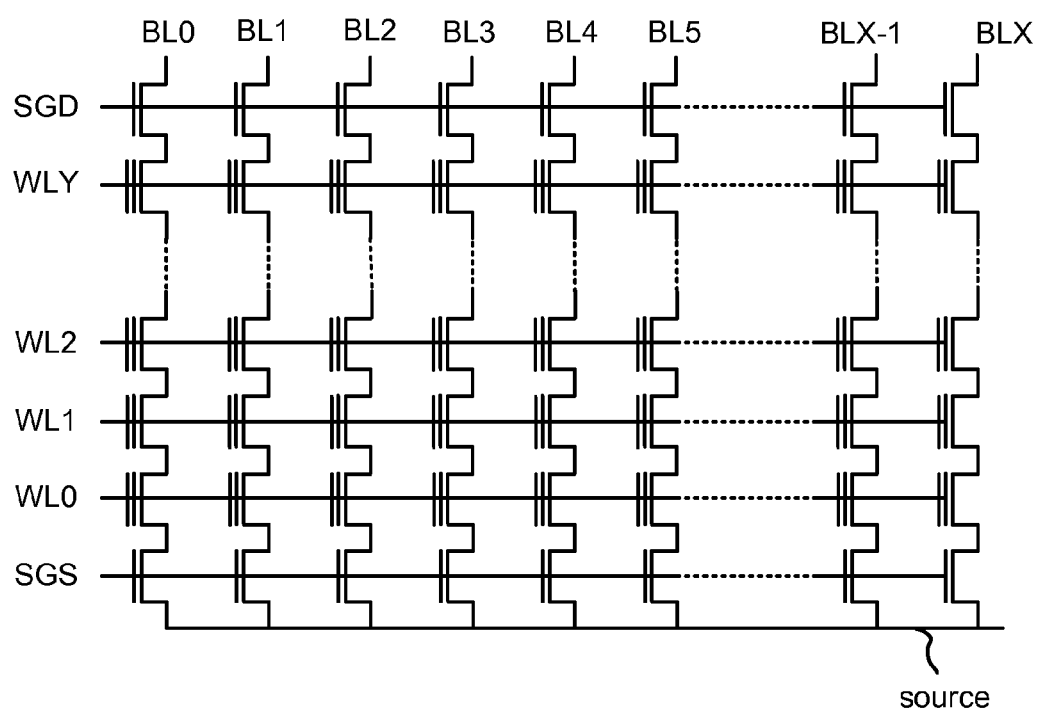
FIG. 3 depicts one embodiment of a memory block including a plurality of NAND strings.

Technology is described for operating a non-volatile storage system in which cross-coupling effects are utilized to extend the effective threshold voltage window of a memory cell and to embed additional information within the extended threshold voltage window. In some cases, additional information may be embedded within a memory cell storing the highest programming state if the memory cell is in a high boosting environment by splitting the highest programming state into two or more substates and programming the memory cell to one of the two or more substates based on the additional information. A memory cell may be in a high boosting environment if one or more of its neighboring memory cells are in a high programmed state. Additional information may also be embedded within a memory cell storing the lowest programming state if the memory cell is in a low boosting environment by splitting the lowest programming state into two or more substates and programming the memory cell to one of the two or more substates based on the additional information. A memory cell may be in a low boosting environment if one or more of its neighboring memory cells are in a low programmed state or an erased state. The additional information may include error correction information such as parity bits.

Non-volatile memory devices typically include two-dimensional arrays of non-volatile memory cells. The memory cells within a two-dimensional array form a single layer of memory cells and may be selected via control lines in the X and Y directions. Non-volatile memory devices may also include monolithic three-dimensional memory arrays in which multiple layers of memory cells are formed above a single substrate without any intervening substrates. Exemplary three-dimensional memory arrays are described in U.S. Pat. No. 6,034,882 to Johnson, entitled "Vertically Stacked Field Programmable Nonvolatile Memory and Method of Fabrication."

Due to cross-coupling effects between a memory cell and its neighboring memory cells (e.g., due to capacitive coupling from one or more adjacent memory cells surrounding the memory cell; three-dimensional memory arrays may have more than eight adjacent memory cells surrounding the memory cell depending on the array geometry), if the neighboring memory cells are programmed after the memory cell is programmed, then the effective threshold voltage for the memory cell may shift higher due to the additional electric field induced by the neighboring memory cells that needs to be overcome in order for the memory cell to "turn-on" and conduct a particular amount of current to be sensed. The cross-coupling effects may be considered as a source of noise as the effective threshold voltage for a memory cell may be a function of both the programmed threshold voltage for the memory cell and the programmed threshold voltages of the neighboring memory cells. The cross-coupling effects caused by capacitive coupling between adjacent memory cells may be mitigated using incremental programming techniques (e.g., multi-step incremental programming schemes such as foggy-fine programming), compensative programming/reading techniques (e.g., precoding/equalization schemes that take into account the programmed/read state of adjacent or neighboring memory cells), or improved ECC techniques (e.g., use of low-density parity check codes in conjunction with soft bit reading). However, these techniques have various downsides. For example, multi-step incremental programming efficiently mitigates cross-coupling effects, but at the expense of sacrificing part of the voltage window and slowing down the programming speed. Precoding and equalization do not fully mitigate cross-coupling effects (they compensate only for the expected cross-coupling induced voltage shift, without compensating for cell-to-cell variations). Moreover, these techniques may significantly slow down programming and/or read speed. Improved ECC schemes may reduce read performance (e.g. due to the need for high resolution reading). Moreover, the ECC redundancy required for handling the cross-coupling induced "noise," may reduce the information density per cell and impact the memory's cost effectiveness.

In one embodiment, the cross-coupling effects may be used in order to allow signaling within an extended threshold voltage window of a memory cell and thus embedding additional information within an extended threshold voltage window of a memory cell. The additional information may comprise overhead, redundancy, or error correcting information. This may be used for improving programming performance, read performance, number of supported write/erase cycles and/or data retention. Alternatively, the redundancy embedded in the extended voltage window may replace the redundancy embedded in designated cells allocated for redundancy, thus reducing the memory cell array size and reducing the overall memory cost. In some embodiments, the additional sensing operations for acquiring the additional information stored within the extended threshold voltage window of a memory cell may be performed only when the additional information is required. In one example, conventional multi-level cell sensing may be performed on a plurality of memory cells to determine one or more pages of data and the additional information may comprise additional ECC parity bits associated with the one or more pages of data that may be read only upon the determination of a sensing failure (or read failure) during the conventional multi-level cell sensing.

FIG. 1 depicts one embodiment of a NAND string 90. FIG. 2 depicts an equivalent circuit diagram for the NAND string of FIG. 1. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string to a bit line 126. Select gate 122 connects the NAND string to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string can have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data. Moreover, although NAND technology using floating-gate transistors is described herein, the technology described herein may also be used with other memory technologies including those that employ charge trapping, phase-change (e.g., chalcogenide materials), or state-change materials.

A typical architecture for a flash memory system using a NAND flash memory structure will include a plurality of NAND strings within a memory block. A memory block may comprise a unit of erase. In some cases, the NAND strings within a memory block may share a common well (e.g., a P-well). Each NAND string is connected to a common source line by its source select gate controlled by select line SGS and connected to its associated bit line by its drain select gate controlled by select line SGD. The use of the terms connect, connected, and connection in this document can include a direct connection or an indirect connection. Typically, each bit line runs on top of its associated NAND string in a direction perpendicular to the word lines and is connected to a sense amplifier. Relevant examples of NAND type flash memories and their operation are provided in the following U.S. Patents/Patent Applications, all of which are herein incorporated by reference: U.S. Pat. No. 5,570,315; U.S. Pat. No. 5,774,397; U.S. Pat. No. 6,046,935; U.S. Pat. No. 6,456, 528; and U.S. Pat. Publication No. US2003/0002348. Other types of non-volatile storage devices, in addition to NAND flash memory, can also be used.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation. Generally, it is important for an appropriate amount of boosting to be used. If the boosting is too low, an inhibited storage element may experience program disturb, in which its threshold voltage is raised to a next higher data state, or to a level at which the storage element cannot be accurately read. On the other hand, if boosting is too high, electromagnetic coupling effects can raise the threshold voltages of the selected storage elements excessively, resulting in undesirable widening of the threshold voltage distributions.

FIG. 3 depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain side select gate controlled by the drain side selection signal SGD. Each NAND string is connected to a source line (source) via a source side select gate controlled by source side selection signal SGS.

In order to save space on a semiconductor die, two adjacent NAND strings (or other grouping in memory cells) may share a common bit line (i.e., a shared-bit-line memory architecture). In some cases, more than two NAND strings may share a common bit line. In one example, the signal SGD may be replaced by two drain side selection signals SGD1 and SGD2. Each NAND string of the pair would then have two drain side select gates, each connected to a different drain side selection signal of the two drain side selection signals SGD1 and SGD2. One of the two drain side select gates for each NAND string may be a depletion mode transistor with its threshold voltage lower than 0 volts. One potential problem with using two select gates on the drain side of each NAND string is that two drain side select gates (as compared to one drain side select transistor) requires more area on the die. Therefore, from an integrated circuit area standpoint, it may be beneficial to only use one drain side selection gate for each NAND string and then connect each NAND string of the pair with only one of the two drain side selection signals.

Figure 4A:
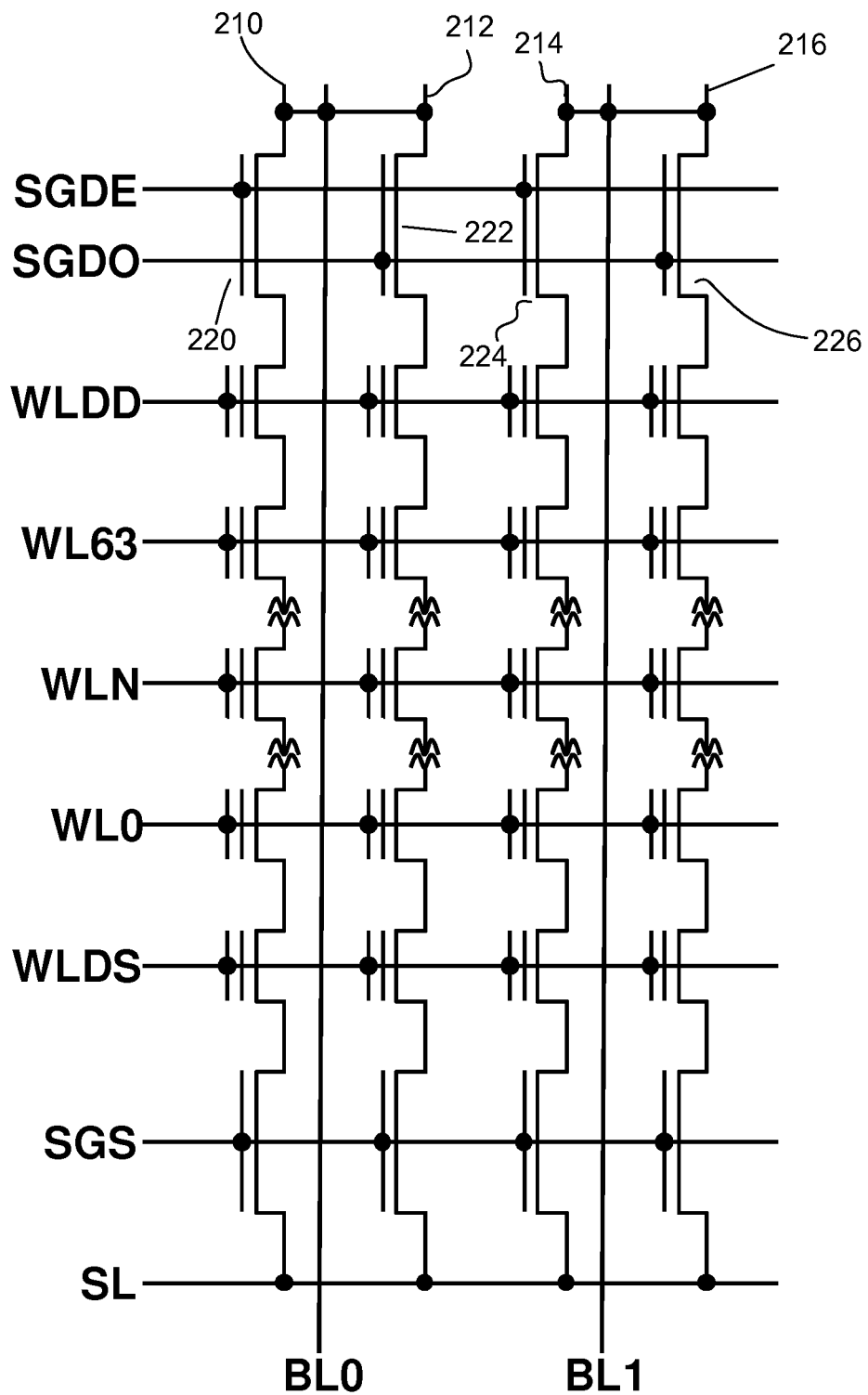
FIG. 4A depicts one embodiment of a non-volatile storage system in which a bit line is shared between two adjacent NAND strings within a memory block.

FIG. 4A depicts one embodiment of a non-volatile storage system in which a bit line is shared between two adjacent NAND strings within a memory block. As depicted, the non-volatile storage system includes four NAND strings (i.e., two pairs of NAND strings corresponding with bit lines BL0 and BL1). Each NAND string includes 64 memory cells corresponding with word lines WL0-WL63. There are two dummy memory cells corresponding with word lines WLDS and WLDD, one on each side of the 64 memory cells. In other embodiments, more than or less than 64 memory cells may be included within a NAND string. The non-volatile storage system includes two drain side selection signals SGDE and SGDO and two bit lines BL0 and BL1. Bit line BL0 is connected to NAND string 210 and NAND string 212. Bit line BL1 is connected to NAND string 214 and NAND string 216. The drain side selection signal SGDE is used to select or unselect NAND string 210 and NAND string 214. The drain side signal SGDO is used to select or unselect NAND string 212 and NAND string 216. Each NAND string only includes one drain side selection gate, implemented as a single transistor. For example, NAND string 210 includes drain side selection gate 220, NAND string 212 includes drain side selection gate 222, NAND string 214 includes drain side selection gate 224, and NAND string 216 includes drain side selection gate 226. Drain side selection signal line SGDE is in communication with selection gate 210 and selection gate 214. Drain side selection signal SGDO is in communication with selection gate 222 and selection gate 226. Each NAND string is in communication with a source line SL via a source select gate controlled by source side selection signal SGS.

Figure 4B:
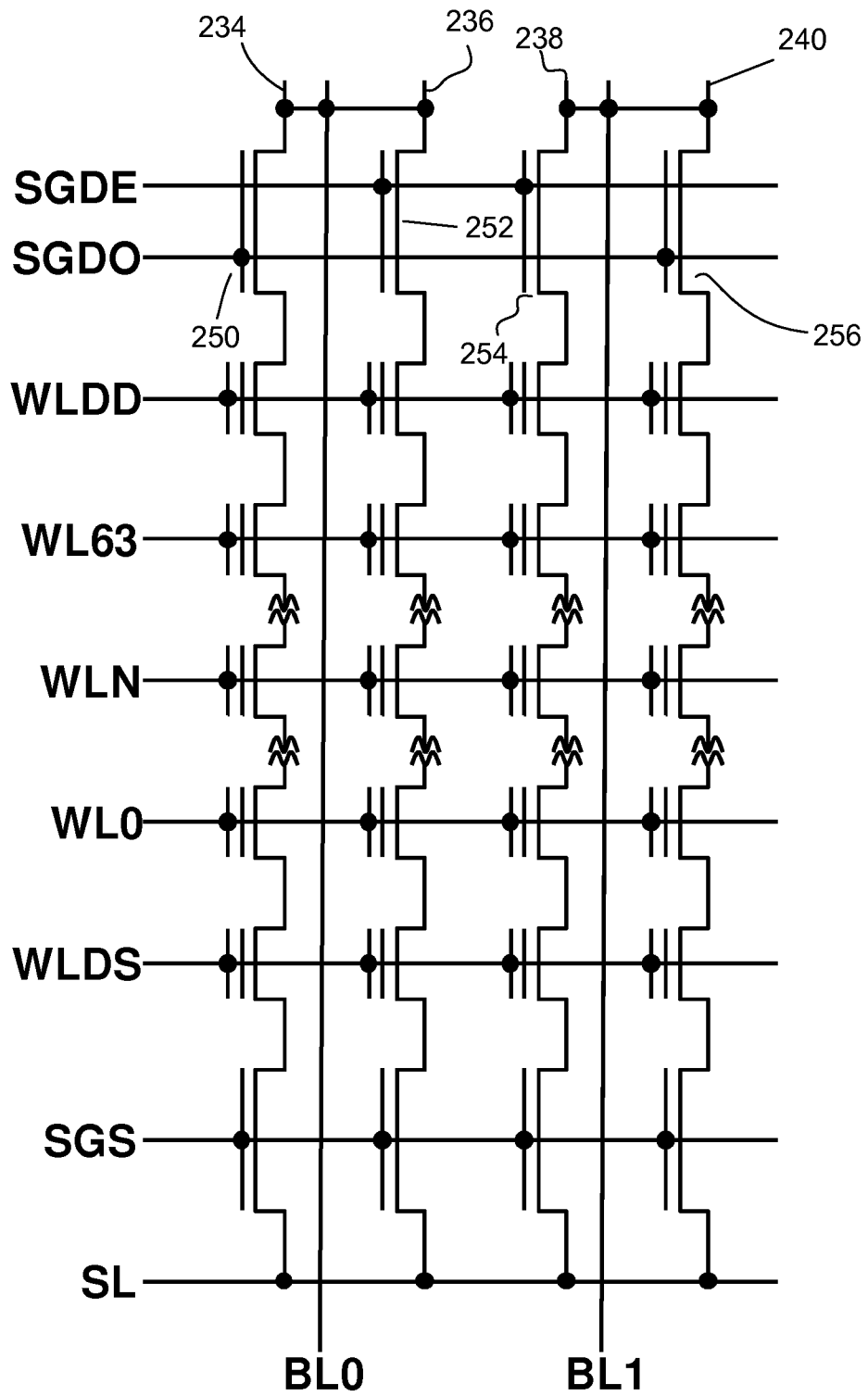
FIG. 4B provides an alternative embodiment of a non-volatile storage system in which a bit line is shared between two adjacent NAND strings.

FIG. 4B provides an alternative embodiment of a non-volatile storage system in which a bit line is shared between two adjacent NAND strings. As depicted, the non-volatile storage system includes four NAND strings (i.e., two pairs of NAND strings corresponding with bit lines BL0 and BL1). The non-volatile storage system includes two drain side selection signals SGDE and SGDO and two bit lines BL0 and BL1. Bit line BL0 is connected to and shared by NAND string 234 and NAND string 236. Bit line BL1 is connected to and shared by NAND string 238 and NAND string 240. The drain side selection signal SGDE is in communication with selection gate 252 and selection gate 254. The drain side selection signal SGDO is in communication with selection gate 250 and selection gate 256. Each NAND string is in communication with a source line SL via a source select gate controlled by source side selection signal SGS. A difference between the embodiments of FIG. 4A and FIG. 4B is that the embodiment of FIG. 4A alternates the connections of the drain side select signals such that every other NAND string has its drain side selection gate in communication with the same drain side selection signal while the embodiment of FIG. 4B has adjacent pairs of NAND strings in communication with the same drain side selection signal.

One benefit of the shared-bit-line NAND architectures depicted in FIGS. 4A-4B is that it relieves the bit line pitch by 2× since pairing NAND strings with a common bit line allows the total number of bit lines to be cut in half. The increase in bit line pitch for a given process geometry allows for less resistive bit line contacts and the reduced total number of bit lines allows for reduced bit line resistance and/or reduced bit line to bit line capacitance between adjacent bit lines. More information regarding the shared-bit-line memory architecture can be found in U.S. Provisional Application 61/561,286, "Improved Operation for Non-Volatile Storage System With Shared Bit Lines Connected to Single Selection Device" and U.S. Provisional Application 61/422,385, "Non-Volatile Storage System With Shared Bit Lines Connected to Single Selection Device," both of which are herein incorporated by reference in their entirety.

Figure 5:
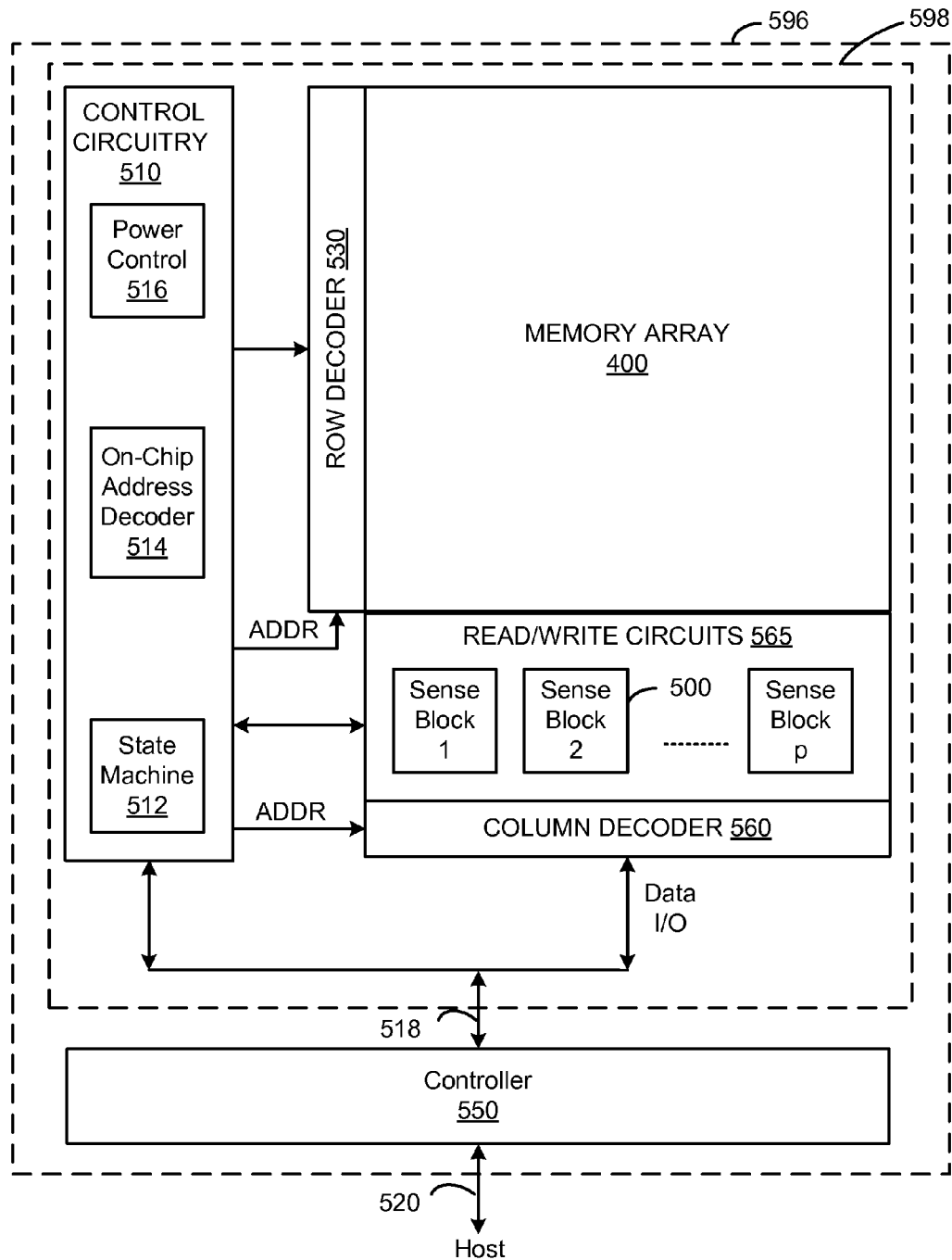
FIG. 5 depicts one embodiment of a non-volatile storage system including read/write circuits for reading and programming memory cells.

FIG. 5 depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 400 (e.g., a two-dimensional or three-dimensional array of storage elements), control circuitry 510, row decoder 530, column decoder 560, and read/write circuits 565. In one embodiment, access to the memory array 400 by the various peripheral circuits (e.g., row decoders or column decoders) is implemented in a symmetric fashion, on opposite sides of the array, so that the densities of access lines and circuitry on each side are reduced by half. The memory array 400 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

The control circuitry 510 cooperates with the read/write circuits 565 to perform memory operations on the memory array 400. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations. In one embodiment, a power control module 516 includes one or more charge pumps that can create voltages larger than the supply voltage.

In some embodiments, one or more of the components (alone or in combination), other than memory array 400, may be referred to as a managing or control circuit. For example, one or more managing or control circuits may include any one of or a combination of control circuitry 510, state machine 512, decoders 530/560, power control 516, sense blocks 500, read/write circuits 565, controller 550, and so forth. The one or more managing circuits may perform or facilitate one or more memory array operations including erasing, programming, or reading operations.

In one embodiment, memory array 400 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 6:
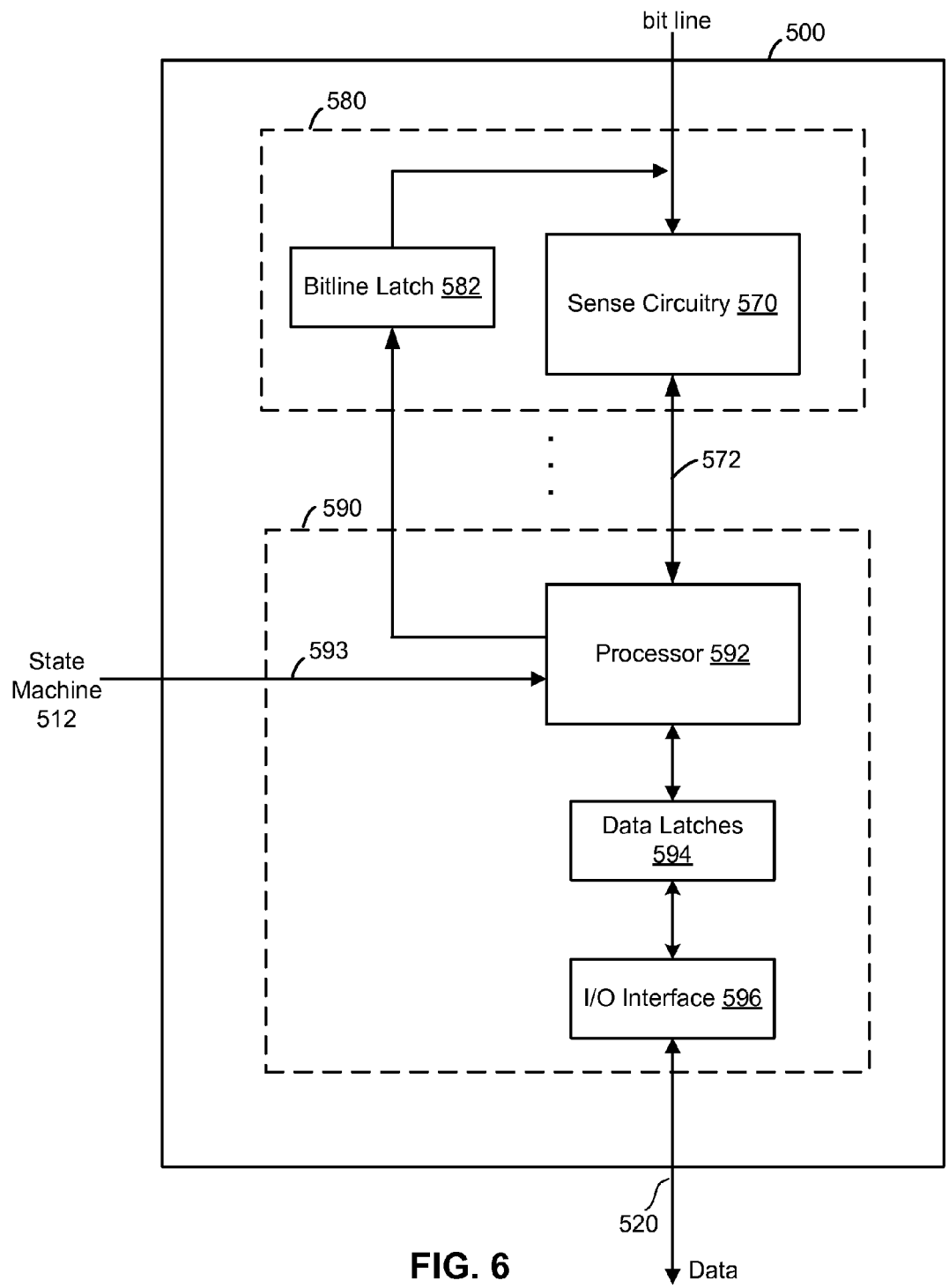
FIG. 6 depicts one embodiment of a sense block.

FIG. 6 depicts one embodiment of a sense block 500, such as sense block 500 in FIG. 5. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 400 in FIG. 5. I/O interface 596 provides an interface between data latches 594 and the data bus 520.

During a read operation or other storage element sensing operation, a state machine, such as state machine 512 of FIG. 5, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 7A:
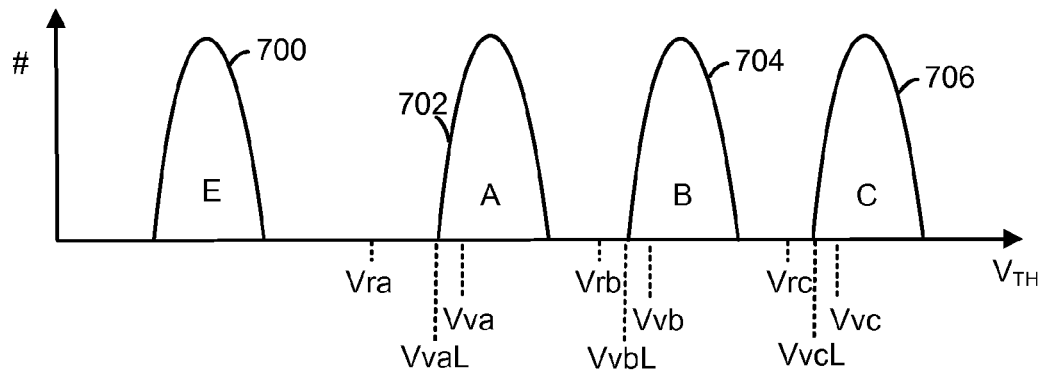
FIG. 7A depicts one embodiment of a set of threshold voltage distributions for a four-state memory device in which each storage element stores two bits of data.

FIG. 7A depicts one embodiment of a set of threshold voltage distributions for a four-state memory device in which each storage element stores two bits of data. A first threshold voltage (Vth) distribution 700 is provided for erased (E-state) storage elements. Three Vth distributions 702, 704 and 706 represent programmed states A, B and C, respectively. In one embodiment, the threshold voltages in the E-state and the threshold voltages in the A, B and C distributions are positive. In another embodiment, the threshold voltage distribution for the E-state is negative, while the threshold voltage distributions for the A-state, B-state and C-state distributions are positive.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

Figure 8:
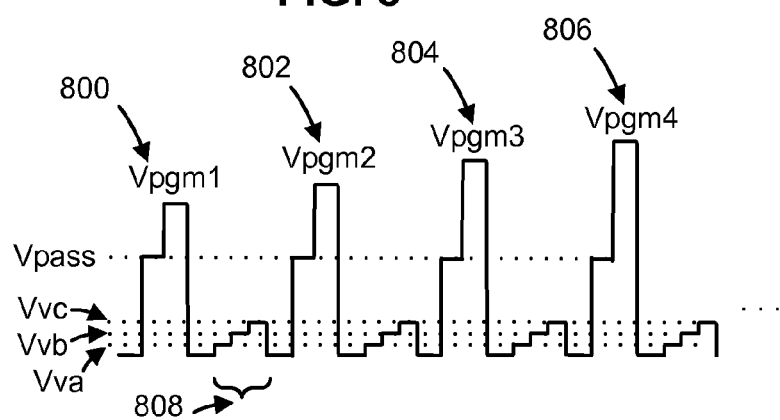
FIG. 8 depicts one embodiment of a series of program and verify pulses which are applied to a selected word line during a programming operation.

In one embodiment, known as full sequence programming, storage elements can be programmed from the E-state directly to any of the programmed states A, B or C. For example, a population of storage elements to be programmed may first be erased so that all storage elements in the population are in the E-state. A series of program pulses, such as depicted in FIG. 8, may then be used to program storage elements directly into states A, B or C. While some storage elements are being programmed from the E-state to the A-state, other storage elements are being programmed from the E-state to the B-state and/or from the E-state to the C-state.

Another option is to use low and high verify levels for one or more data states. For example, VvaL and Vva are lower and higher verify levels, respectively, for the A-state, VvbL and Vvb are lower and higher verify levels, respectively, for the B-state, and VvcL and Vvc are lower and higher verify levels, respectively, for the C-state. In some cases, VvcL is not used since reduced programming precision may be acceptable for the highest state. During programming, when the Vth of a storage element which is being programmed to the A-state as a target state exceeds VvaL, the programming speed of the storage element is slowed down, in a slow programming mode, such as by raising the associated bit line voltage to a level, e.g., 0.6-0.8 V, which is between a nominal program or non-inhibit level, e.g., 0 V and a full inhibit level, e.g., 4-6 V. This provides greater accuracy by avoiding large step increases in threshold voltage. When the Vth reaches Vva, the storage element is locked out from further programming. Similarly, when the Vth of a storage element which is being programmed to the B-state as a target state exceeds VvbL, the programming speed of the storage element is slowed down, and when the Vth reaches Vvb, the storage element is locked out from further programming. Optionally, when the Vth of a storage element which is being programmed to the C-state as a target state exceeds VvcL, the programming speed of the storage element is slowed down, and when the Vth reaches Vvc, the storage element is locked out from further programming. This programming technique has been referred to as a quick pass write or dual verify technique. Note that, in one approach, dual verify levels are not used for the highest state since some overshoot is typically acceptable for that state. Instead, the dual verify levels can be used for the programmed states, above the erased state, and below the highest state.

Figure 7B:
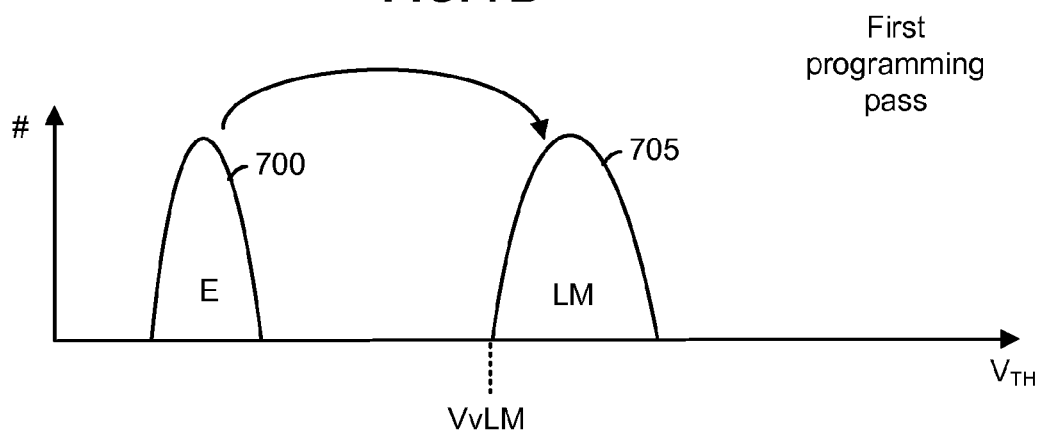
FIG. 7B depicts one embodiment of a first pass of a two-pass programming technique.

FIG. 7B depicts one embodiment of a first pass of a two-pass programming technique. In this example, a multi-state storage element stores data for two different pages: a lower page and an upper page. Four states are depicted by repeating the threshold voltage distributions 700, 702, 704 and 706 from FIG. 7A. These states, and the bits they represent, are: E-state (11), A-state (01), B-state (00) and C-state (10). For E-state, both pages store a "1." For A-state, the lower page stores a "1" and the upper page stores a "0." For B-state, both pages store "0." For C-state, the lower page stores "0" and the upper page stores "1." Note that although specific bit patterns have been assigned to each of the states, different bit patterns may also be assigned.

In the first programming pass, the lower page is programmed for a selected word line WLn. If the lower page is to remain data 1, then the storage element state remains at state E (distribution 700). If the data is to be programmed to 0, then the threshold voltage of the storage elements on WLn are raised such that the storage element is programmed to an intermediate (LM or lower-middle) state (distribution 705).

Figure 9A:
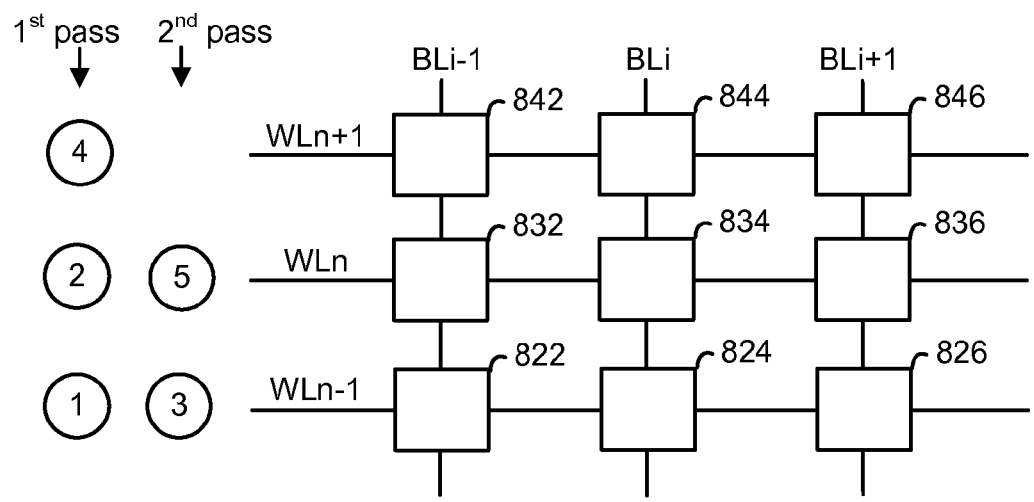
FIG. 9A depicts one embodiment of a multi-pass program operation for a set of storage elements.

In one embodiment, after a storage element is programmed from the E-state to the LM-state, as indicated by step "1" in FIG. 9A, its neighbor storage element on an adjacent word line WLn+1 in the NAND string will then be programmed with respect to its lower page in a respective first programming pass of the adjacent word line, as indicated by step "2" in FIG. 9A.

Figure 7C:
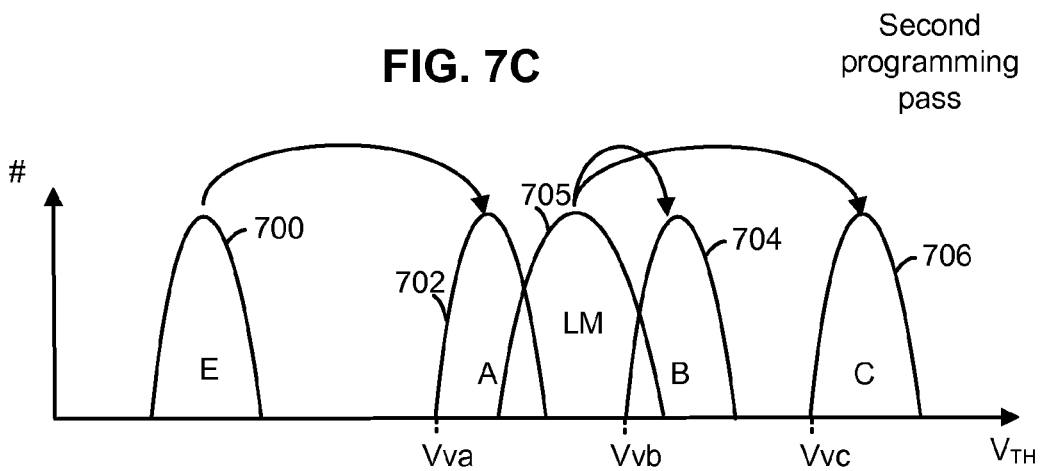
FIG. 7C depicts one embodiment of a second pass of the two-pass programming technique referred to in FIG. 7B.

FIG. 7C depicts one embodiment of a second pass of the two-pass programming technique referred to in FIG. 7B. The A-state storage elements are programmed from the E-state distribution 700 to the A-state distribution 702, the B-state storage elements are programmed from the LM-state distribution 705 to the B-state distribution 704, and the C-state storage elements are programmed from the LM-state distribution 705 to the C-state distribution 706. The second pass of the two-pass programming technique for WLn is indicated by step "3" in FIG. 9A. The second pass of the two-pass programming technique for WLn+1 is indicated by step "5" in FIG. 9A.

Figure 7D:
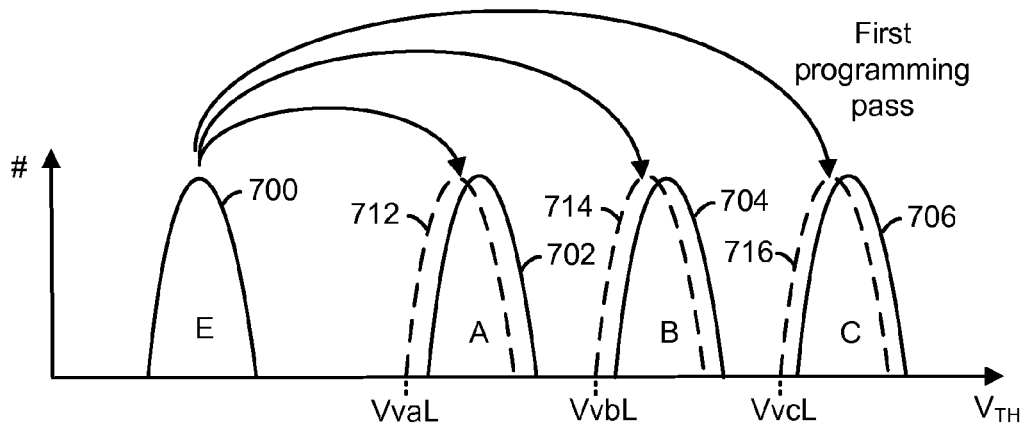
FIG. 7D depicts one embodiment of a first pass of another two-pass programming technique.

FIG. 7D depicts one embodiment of a first pass of another two-pass programming technique. In this example, referred to as foggy-fine (or course-fine) programming, the A-state, B-state and C-state storage elements are programmed from the E-state to distributions 712, 714 and 716, respectively, using lower verify levels VvaL, VvbL and VvcL, respectively. This is the foggy (or course) programming pass. A relatively large program voltage step size may be used, for instance, to quickly program the storage elements to the respective lower verify levels.

Figure 7E:
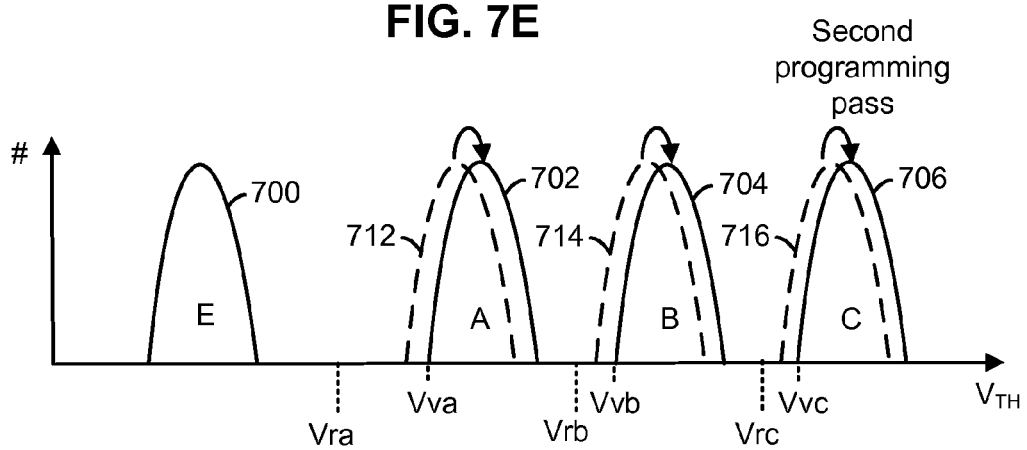
FIG. 7E depicts one embodiment of a second pass of the two-pass programming technique referred to in FIG. 7D.

FIG. 7E depicts one embodiment of a second pass of the two-pass programming technique referred to in FIG. 7D. The A-state, B-state and C-state storage elements are programmed from the respective lower distributions to respective final distributions 702, 704 and 706, respectively, using the nominal, higher verify levels Vva, Vvb and Vvc, respectively. This is the fine programming pass. A relatively small program voltage step size may be used, for instance, to slowly program the storage elements to the respective final verify levels while avoiding a large overshoot.

Although the programming examples depict four data states and two pages of data, the concepts described herein may be applied to other implementations with more or fewer than four states and more or fewer than two pages. For example, memory devices may utilize eight or sixteen states per storage element. Moreover, in the example programming techniques discussed herein, the Vth of a storage element may be raised gradually as it is programmed to a target data state.

However, programming techniques can be used in which the Vth of a storage element may be lowered gradually as it is programmed to a target data state. Programming techniques which measure storage element current can be used as well. The concepts described herein may be adapted to the different programming techniques.

FIG. 8 depicts one embodiment of a series of program and verify pulses which are applied to a selected word line during a programming operation. A programming operation may include multiple program-verify iterations, where each iteration applies one or more programming voltages followed by one or more verify voltages, to a selected word line. In one embodiment, the program voltages are stepped up in successive iterations. Moreover, each program voltage may include a first portion which has a pass voltage (Vpass) level, e.g., 6-8 V, followed by a second, highest amplitude portion at a program level, e.g., 12-25 V. For example, a first, second, third and fourth program pulses 800, 802, 804 and 806 have program levels of Vpgm1, Vpgm2, Vpgm3 and Vpgm4, respectively, and so forth. One or more verify voltages 808, such as verify voltages Vva, Vvb and Vvc, may be provided after each program pulse. In some cases, one or more initial program pulses are not followed by verify pulses because it is not expected that any storage elements have reached the lowest program state (e.g., A-state). Subsequently, in some cases, program iterations may use verify pulses for the A-state, followed by program iterations which use verify pulses for the A-states and B-states, followed by program iterations which use verify pulses for the B-states and C-states.

FIG. 9A depicts one embodiment of a multi-pass program operation for a set of storage elements. As depicted, the storage elements 822, 832, 842, 824, 844, 826, 836, and 846 comprise the eight adjacent (or neighboring) storage elements of storage element 834. The components depicted may be a subset of a much larger set of storage elements, word lines and bit lines. In one possible program operation, storage elements on word line WLn−1, e.g., storage elements 822, 824 and 826, are programmed in a first programming pass. This step is represented by the circled "1." Next ("2"), storage elements on word line WLn, e.g., storage elements 832, 834 and 836, are programmed in a first programming pass. In this example, when a word line is selected for programming, verify operations occur after each program pulse. During the verify operations on word line WLn, one or more verify voltages are applied to word line WLn and pass voltages are applied to the remaining word lines including word line WLn−1 and word line WLn+1. The pass voltages are used to turn on (i.e., make conductive) the unselected storage elements so that a sensing operation can occur for the selected word line. Next ("3"), storage elements on word line WLn−1 are programmed in a second programming pass. Next ("4"), storage elements on word line WLn+1, e.g., storage elements 842, 844 and 846, are programmed in a first programming pass. Next ("5"), the storage elements on word line WLn are programmed in a second programming pass to their respective target states.

Figure 9B:
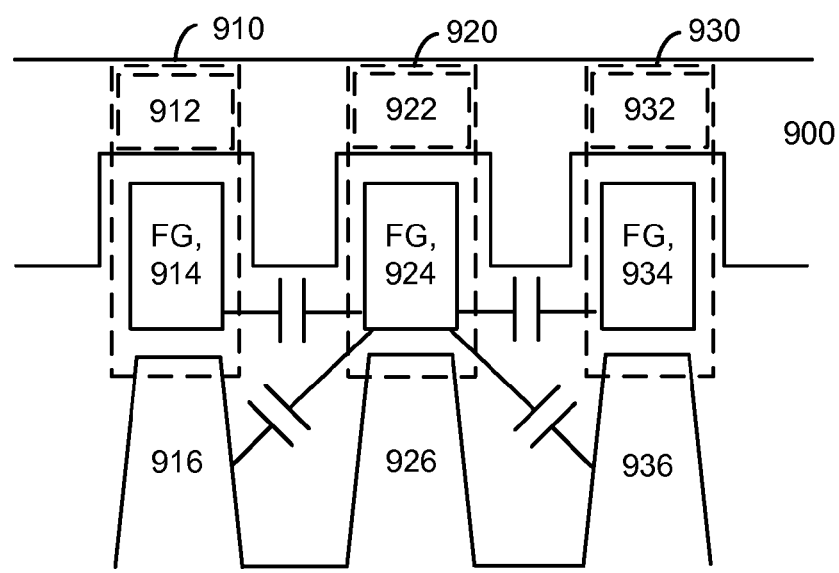
FIG. 9B depicts one embodiment of a cross-sectional view of NAND strings showing channel-to-floating gate coupling and floating gate-to-floating gate coupling.

FIG. 9B depicts one embodiment of a cross-sectional view of NAND strings showing channel-to-floating gate coupling and floating gate-to-floating gate coupling. A bit line or NAND string direction goes into the page, and a word line direction goes horizontal from left to right. A word line 900 extends across multiple NAND strings. A first NAND string includes a channel region 916. A storage element 910 in the first NAND string includes a control gate 912, which is a portion of the word line 900, and a floating gate 914. A second NAND string includes a channel region 926. A storage element 920 in the second NAND string includes a control gate 922, which is a portion of the word line 900, and a floating gate 924. A third NAND string includes a channel region 936. A storage element 930 in the third NAND string includes a control gate 932, which is a portion of the word line 900, and a floating gate 934. As depicted, storage elements 910 and 930 share the same word line with and are adjacent to storage element 920.

Figure 10A:
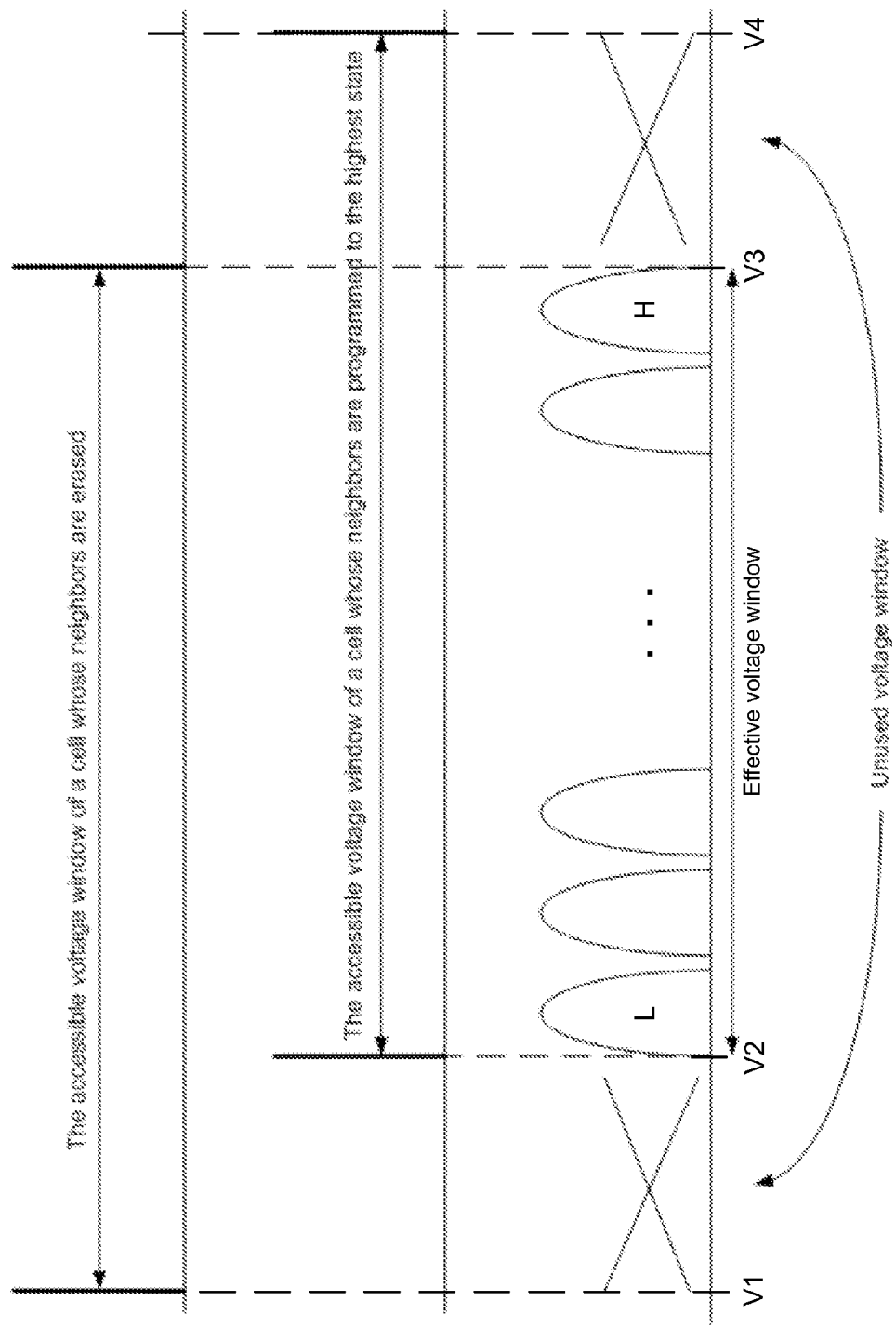
FIG. 10A depicts one embodiment of an effective threshold voltage window for a memory cell.

FIG. 10A depicts one embodiment of an effective threshold voltage window for a memory cell. As depicted, an intrinsic threshold voltage window of a memory cell may comprise the range of threshold voltages between voltage V1 and voltage V3. The intrinsic threshold voltage window may comprise the range of threshold voltages into which a memory cell may be programmed given that the memory cell is in a low boosting environment. A memory cell may be within a low boosting environment if its neighbors are erased or are in a low programmed state (e.g., the A-state of FIG. 7A as compared with the C-state of FIG. 7A). In some cases, the range of the intrinsic threshold voltage window may be limited by the amount of charge that may be placed on a floating gate of the memory cell without causing memory cell breakdown or program disturb effects. The range of the intrinsic threshold voltage window may also be limited by the maximum number of programming pulses that may be applied to the memory cell in order to satisfy programming throughput constraints and/or program disturb constraints.

Due to cross-coupling effects between a memory cell and its neighboring memory cells (e.g., due to coupling from one or more of the eight adjacent memory cells surrounding the memory cell), if the neighboring memory cells are programmed, then the effective threshold voltage for the memory cell may shift higher compared to its intrinsic threshold voltage due to the additional electric field induced by the neighboring memory cells that needs to be overcome in order for the memory cell to "turn-on" and conduct a particular amount of current to be sensed. The cross-coupling effects may be considered as a source of noise as the effective threshold voltage for a memory cell may be a function of both the programmed threshold voltage (corresponding with the target programming state) for the memory cell and the programmed threshold voltages of the neighboring memory cells (which may be treated as random variables). A boosted threshold voltage window of a memory cell may comprise the range of threshold voltages between voltage V2 and voltage V4. The boosted threshold voltage window may comprise the range of threshold voltages into which a memory cell may be programmed given that the memory cell is in a high boosting environment. A memory cell may be within a high boosting environment if one or more of its neighbors are in a high programmed state (e.g., the C-state of FIG. 7A).

In one embodiment, the determination of whether a memory cell is in a low boosting environment or a high boosting environment may be a binary determination, meaning that either the memory cell is deemed to be in the low boosting environment or the high boosting environment. In another embodiment, the determination of whether a memory cell is in a low boosting environment or a high boosting environment may be more refined having more than two boosting magnitudes. In this case, the determination of the boosting level of a cell may be associated with a reliability value of whether the memory cell is within a high boosting environment. The reliability value may comprise a probability value or a degree of confidence value that the memory cell is within a high boosting environment. In some embodiments, the reliability value may be generated by sensing programming states associated with one or more neighboring memory cells adjacent to the memory cell. In one example, a neighboring memory cell of the memory cell corresponding with a next word line (e.g., word line WLn+1) may be sensed and an LM (or lower-middle) bit may be generated corresponding with whether the neighboring memory cell has been programmed to the upper half of a voltage window or the lower half of the voltage window (e.g., by sensing between states C and D in FIG. 10B). In another example, one or more neighboring data values associated with one or more neighboring memory cells of the memory cell may be sensed and a weighted average based on coupling ratios may be computed to determine the boosting level or the reliability value associated to it. In some cases, a determination of the actual programming state of each of the one or more neighboring memory cells may be used to determine the reliability value (e.g., via high resolution sensing).

As depicted, the effective threshold voltage window (or main voltage window) may comprise the range of threshold voltages between voltage V2 and voltage V3. The effective voltage window associated with a memory cell may comprise the range of threshold voltages that is accessible given any boosting condition imposed on the memory cell by other memory cells (e.g., via coupling from neighboring memory cells). An extended voltage window associated with the memory cell may comprise an extended range of threshold voltages outside the effective voltage window (i.e., the extended voltage window may include threshold voltages lower than or higher than the threshold voltages of the effective voltage window). The lowest distribution (L) and the highest distribution (H) within the effective threshold voltage window may be referred to as edge programming states (or edge states).

Within the effective threshold voltage window, a set of threshold voltage distributions may be created ranging from the lowest distribution (L) representing the lowest programming state to the highest distribution (H) representing the highest programming state. In some cases, multi-step incremental programming methods that ensure that in the final programming step of a memory cell that its neighboring memory cells are already programmed close to their final target threshold voltages (e.g., foggy-fine programming) may be used to mitigate cross-coupling effects. However, this mitigation typically comes at the expense of sacrificing part of the voltage window. For example, if a memory cell is to be programmed to the highest distribution (H) and the memory cell is in a low boosting environment (e.g., the neighboring memory cells are erased or have been programmed to low programming states), then the memory cell's floating gate may be charged with a particular amount of charge (subject to limitations on the programming voltages applied to the memory cell and the number of programming pulses applied to the memory cell). However, if the memory cell is to be programmed to the highest distribution (H) and the memory cell is in a high boosting environment (e.g., one or more neighboring memory cells have been programmed to a high programming state), then the memory cell's floating gate may be charged with an amount of charge less than the particular amount of charge as the cross-coupling effects from the neighboring memory cells may increase (or boost) the effective threshold voltage of the memory cell. Thus, a memory cell in a high boosting environment may not be fully using its threshold voltage window and therefore the memory cell may be programmed to a higher effective threshold voltage by placing more charge on its floating gate. Hence, multi-step incremental programming methods utilize the intersection of the voltage window induced by the various boosting environments, resulting in a smaller utilized voltage window (i.e. V2 to V3) compared to the intrinsic voltage window of the cell (i.e. V1 to V3) and compared to the full span of threshold voltages that cells may occupy (i.e. V1 to V4).

Figure 10B:
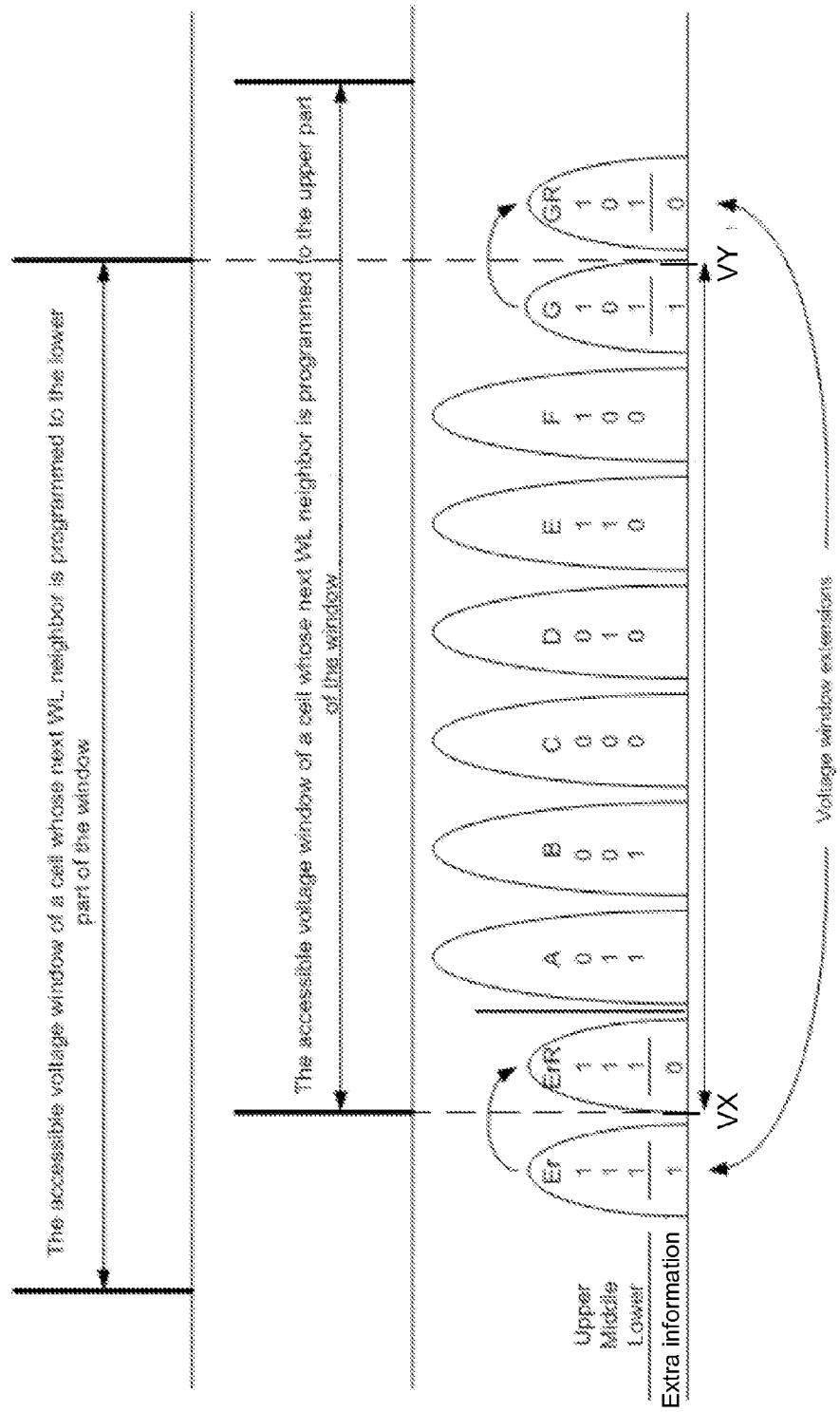
FIG. 10B depicts one embodiment of an extended threshold voltage window for a memory cell.

FIG. 10B depicts one embodiment of an extended threshold voltage window for a memory cell. As depicted, the threshold voltage window between voltages VX and VY includes eight distributions corresponding with the erased state and programming states A through G. The state mapping into the eight distributions may comprise a Gray code mapping. Each of the eight distributions may correspond with an assignment of three data bits. For example, the highest programming state (i.e., the G-state) may correspond with an upper data bit equal to "1," a middle data bit equal to "0," and a lower data bit equal to "1." In some cases, the memory cell may comprise a three bit per cell multi-level cell and the three data bits may comprise bits within three separate pages (e.g., the upper, middle, and lower pages).

As depicted, the highest programming state (i.e., the G-state) has been split into two substates G and GR. Substate GR corresponds with threshold voltages higher than voltage VY. The lowest programming state (i.e., the erased state) has been split into two substates Er and ErR. Substate Er corresponds with threshold voltages lower than voltage VX. Extra information may be embedded within the extended window by selectively programming the substates of a split state based on the extra information (e.g., by programming to either substate Er or substate ErR if an erased state is the intended programming state, or by programming to either substate G or substate GR if the G-state is the intended programming state). In one embodiment, the highest programming state (e.g., the G-state) may be split, while the lowest programming state may not be split (e.g., due to negative voltage sensing limitations). In some embodiments, the highest programming state and/or the lowest programming state may be split into two or more substates (e.g., the G-state may be split into four substates).

One advantage of the encoding scheme depicted is that conventional multi-level cell reading may be performed without modification to retrieve one or more pages. However, if the extra information is needed, then additional sensing operations may be performed to acquire the extra information. The extra information may include extra data bits, extra ECC parity bits, timestamp information, redirection information, or other overhead information associated with the one or more pages. In one embodiment, the extra information may comprise one or more ECC parity bits associated with an extra page of parity bits. The extra page of parity bits may be utilized on top of conventional ECC encoding used to protect the data stored in the one or more pages.

In one embodiment, during a programming operation, an extra bit may be programmed by selecting between the two substates of the highest programming state (e.g., selecting between substates G and GR) if the target programming state for a memory cell is state G and the memory cell is within a high boosting environment. In one example, the memory cell may be deemed to be within a high boosting environment if its next word line neighbor memory cell (e.g., the memory cell sharing the same bitline on the word line above the word line associated with the memory cell) is programmed to the upper half of the voltage window (e.g., to states D, E, F, or G).

In one embodiment, during a programming operation, an extra bit may be programmed by selecting between the two substates of the lowest programming state (e.g., selecting between substates Er and ErR) if the target programming state for a memory cell is the erased state and the memory cell is within a low boosting environment. In one example, the memory cell may be deemed to be within a low boosting environment if its next word line neighbor memory cell (e.g., the memory cell sharing the same bitline on the word line above the word line associated with the memory cell) is programmed to the lower half of the voltage window (e.g., states A, B, or C) or an erased state.

Figure 11A:
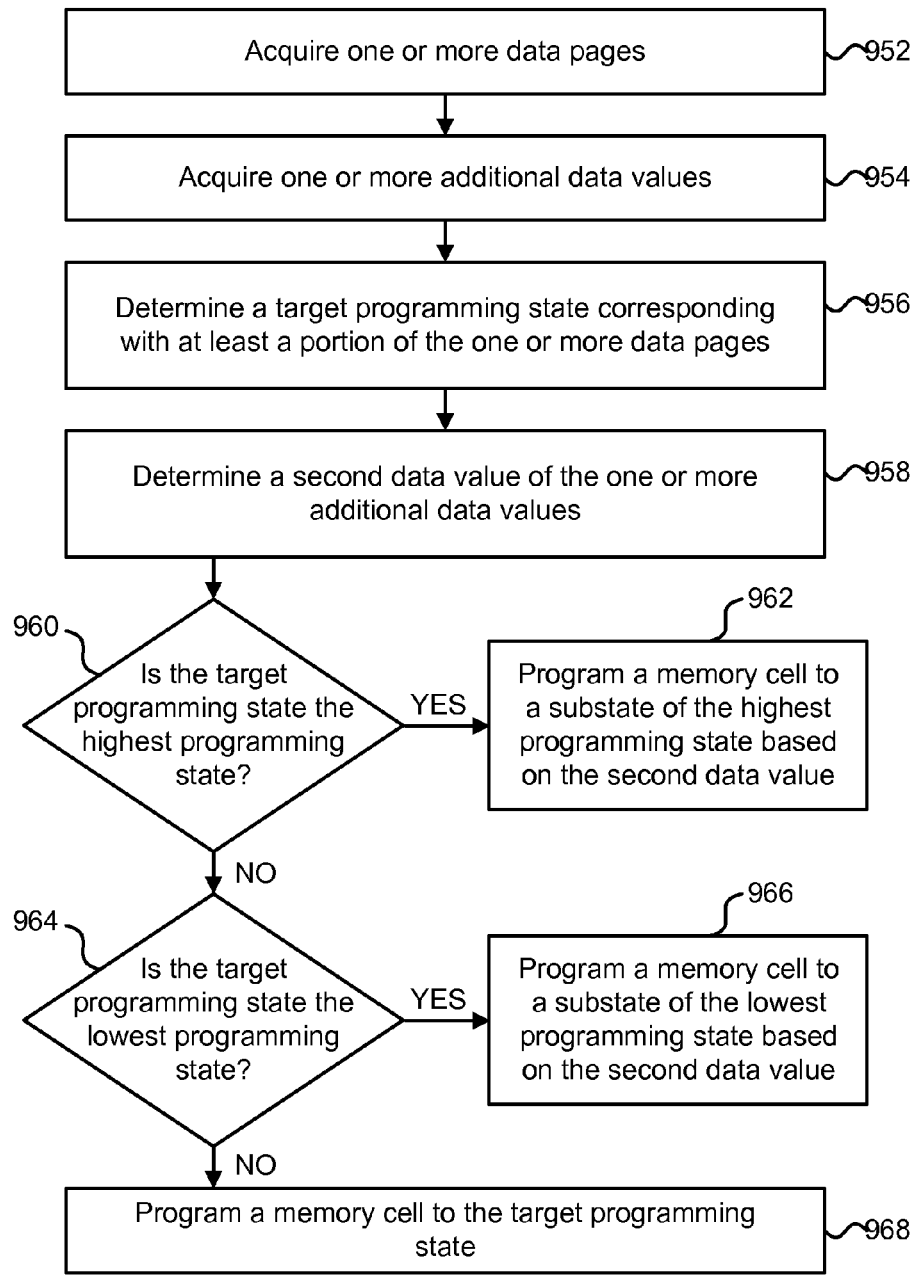
FIG. 11A is a flowchart describing one embodiment of a process for embedding information within an extended threshold voltage window of a memory cell.

FIG. 11A is a flowchart describing one embodiment of a process for embedding information within an extended threshold voltage window of a memory cell. In one embodiment, the process of FIG. 11A may be performed by a non-volatile storage system, such as non-volatile storage system 596 in FIG. 5.

In step 952, one or more data pages are acquired. The one or more data pages may be acquired from a host computing device, such as a digital camera or mobile computing device. In step 954, one or more additional data values are acquired. In one embodiment, the one or more additional data values may be acquired from a host computing device, such as a digital camera or mobile computing device. In another embodiment, the one or more additional data values may be generated by a non-volatile storage system prior to programming the one or more data pages. For example, the one or more additional data values may comprise error correction information (e.g., parity bits) associated with the one or more data pages.

In step 956, a target programming state corresponding with at least a portion of the one or more data pages is determined. In one embodiment, the one or more data pages may correspond with three data pages (e.g., an upper, middle, and a lower page) and the target programming state may be determined based on a bit location of the three data pages. The target programming state may be one of eight possible programming states associated with the three data bits to be stored in a memory cell (i.e., the memory cell comprises a three bit per cell multi-level cell). In step 958, a second data value of the one or more additional data values is determined. The second data value may correspond with a parity bit of a parity page associated with the one or more data pages.

In step 960, it is determined whether the target programming state is the highest programming state within a voltage window. If it is determined that the target programming state corresponds with the highest programming state, then step 962 is performed. Otherwise, if it is determined that the target programming state is not the highest programming state, then step 964 is performed. In step 962, a memory cell is programmed to a substate of the highest programming state based on the second data value. In one embodiment, the highest programming state may comprise the highest threshold voltage distribution of eight possible threshold voltage distributions (e.g., the G-state of FIG. 10B). The highest programming state may be associated with two substates. The two substates may include a first substate of the highest programming state corresponding with a second data value equal to "1" and a second substate of the highest programming state corresponding with a second data value equal to "0."

In one embodiment, a memory cell being programmed using foggy-fine programming may be programmed to state GR by using an additional verify level for state GR during the fine stage (or during both the foggy and fine stages of foggy-fine programming). In some embodiments, the ninth verify level for state GR may be omitted. In this case, state GR may be programmed in the open loop, without verifying the ninth verify level (e.g., by preventing memory cells that are intended for the state GR from being inhibited). Open loop programming, however, may lead to over programming issues with the memory cell.

In another embodiment, a target memory cell being programmed using foggy-fine programming may be programmed to state GR by first verifying a neighboring memory cell (e.g., a neighboring memory cell associated with a next word line) during a foggy stage at a verify level that is lower than a conventional verify level by a particular amount, performing fine stage programming on the target memory cell, and then performing fine stage programming on the neighboring memory cell. The particular amount may be determined such that when the neighboring memory cell is programmed to its final state during its fine programming stage, it will cause the target memory cell being programmed to move from state G to state GR.

In step 964, it is determined whether the target programming state is the lowest programming state within a voltage window. If it is determined that the target programming state corresponds with the lowest programming state, then step 966 is performed. Otherwise, if it is determined that the target programming state is not the lowest programming state, then step 968 is performed. In step 966, a memory cell is programmed to a substate of the lowest programming state based on the second data value. In one embodiment, the lowest programming state may comprise the lowest threshold voltage distribution of eight possible threshold voltage distributions (e.g., the erased state Er of FIG. 10B). The lowest programming state may be associated with two substates. The two substates may include a first substate of the lowest programming state corresponding with a second data value equal to "1" and a second substate of the lowest programming state corresponding with a second data value equal to "0." In one embodiment, a memory cell being programmed using foggy-fine programming may be programmed to state ErR by using an additional verify level for state ErR during the fine stage (or during both the foggy and fine stages of foggy-fine programming). In step 968, a memory cell is programmed to the target programming state. In this case, the target programming state comprises a middle programming state within the voltage window of the memory cell. The memory cell may be programmed to the target programming state using an incremental programming technique, such as foggy-fine programming.

In one embodiment, the one or more additional data values may comprise a parity page including redundant parity bits. In one example, each parity bit may be repeated 16 times (or more) within the parity page. Assuming a non-volatile storage device comprising three bit per cell memory cells and an equal probability for all programming states (e.g., no shaping of the data to skew the distribution of programming states), then the expected percentage of cells that can reliably embed the additional data value (i.e. the parity bits of the extra parity page) is 12.5%; ⅛*½ (i.e., assuming half of the memory cells programmed to the highest programming state are in a high boosting environment)+⅛*½ (i.e., assuming half of the memory cells programmed to the lowest programming state are in a low boosting environment). For a non-volatile storage device comprising two bit per cell memory cells, the expected percentage of cells that can reliably embed the additional data value (i.e. the parity bits of the extra parity page) would be 25%; ¼*½ (i.e., assuming half of the memory cells programmed to the highest programming state are in a high boosting environment)+¼*½ (i.e., assuming half of the memory cells programmed to the lowest programming state are in a low boosting environment). If only the highest programming state is used to embed the one or more additional data values, then the percentage of extendable bits would be reduced by a factor of two.

In some embodiments, the one or more additional data values may comprise an extra parity page that may be shared among the one or more data pages. In one example, the extra parity page may include parity information (e.g., parity bits)

associated with each of the one or more data pages individually. In another example, the extra parity page may include parity information covering all of the one or more data pages (i.e., the parity information may be generated based on data within each of the one or more data pages).

In one embodiment, the one or more data pages may comprise a lower page, a middle page, and an upper page and the one or more additional data values may comprise an extra parity page. In one example, the extra parity page may include multiple repetitions (or copies) of each of one or more parity bits. A particular parity bit of the extra parity page may be determined during its decoding by performing a majority vote of corresponding multiple copies of the particular parity bit or by summing log-likelihood ratios (LLRs) associated with the multiple copies of the particular parity bit. In some cases, the extra parity page may comprise a set of 2 KB parity bits that are each repeated 8 times to generate the 16 KB extra parity page. The 16 KB extra parity page may be shared among all of the one or more data pages. In some cases, as the expected percentage of cells that can reliably embed an additional data value in the extended window may be small (e.g. 12.5% in a three bit per cell memory or 25% in a two bit per cell memory), then repeating every parity bit multiple times increases the probability that at least one copy of the parity bit will be stored reliably.

In some cases, parity pages may be generated for each of the one or more data pages and a combined function, such as an exclusive OR (or XOR), of the parity pages may be generated and stored as the extra parity page. In one example, a lower parity page (PL) may be generated from the lower page, a middle parity page (PM) may be generated from the middle page, and an upper parity page (PU) may be generated from the upper page. The extra parity page stored as the one or more additional data values may comprise PL XOR PM XOR PU. Thus, the extra parity page may incorporate parity information covering all of the one or more data pages.

Figure 11B:
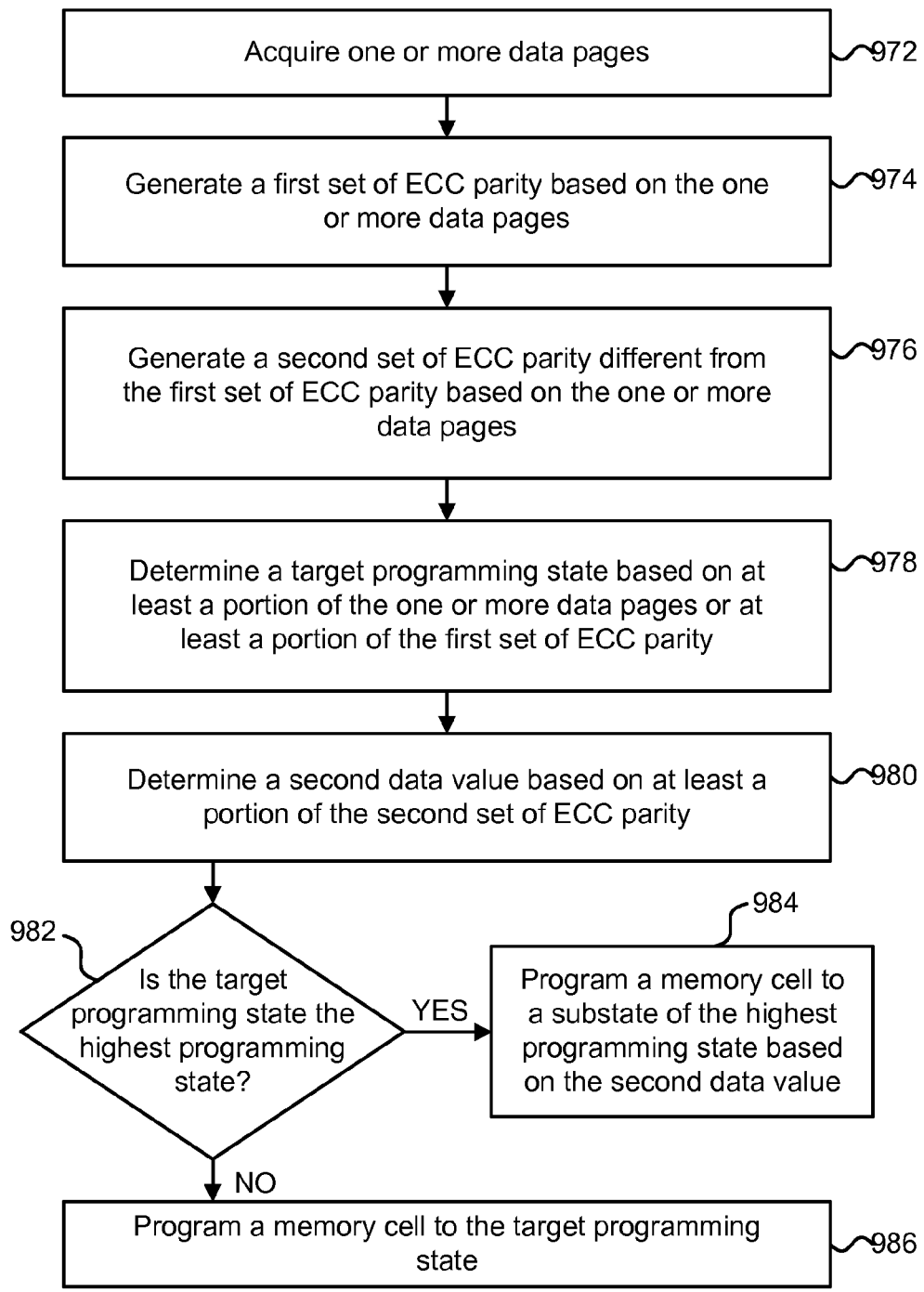
FIG. 11B is a flowchart describing one embodiment of a process for embedding information within an extended threshold voltage window of a memory cell.

FIG. 11B is a flowchart describing one embodiment of a process for embedding information within an extended threshold voltage window of a memory cell. In one embodiment, the process of FIG. 11B may be performed by a non-volatile storage system, such as non-volatile storage system 596 in FIG. 5.

In step 972, one or more data pages are acquired. The one or more data pages may be acquired from a host computing device, such as a digital camera or mobile computing device. The one or more data pages may comprise three different pages of data. In step 974, a first set of ECC parity is generated based on the one or more data pages. In one embodiment, the first set of ECC parity may be generated by a non-volatile storage system prior to programming the one or more data pages. For example, the first set of ECC parity may comprise error correction parity bits associated with one or more of the one or more data pages. The first set of ECC bits may comprise Reed Solomon ECC codes, low density parity check codes, or turbo codes.

In step 976, a second set of ECC parity different from the first set of ECC parity is generated based on the one or more data pages. The second set of ECC parity may be generated by a non-volatile storage system prior to programming the one or more data pages. In one example, the second set of ECC parity may comprise error correction parity bits associated with each of the one or more data pages. The second set of ECC bits may comprise Reed Solomon ECC codes, low density parity check codes, or turbo codes.

In step 978, a target programming state is determined based on at least a portion of the one or more data pages or at least a portion of the first set of ECC parity. In this case, information corresponding with the one or more data pages and/or the first set of ECC parity may be stored within a non-extended portion of the voltage window of a memory cell. In one embodiment, the one or more data pages may correspond with three data pages (e.g., an upper, middle, and a lower page) and the target programming state may be determined based on information stored at a bit location of the three data pages. In another embodiment, the first set of ECC parity may include parity information (e.g., parity bits) corresponding with each of the three data pages and the target programming state may be determined based on information stored at a bit location of the parity information. The target programming state may be one of eight possible programming states associated with the three data bits to be stored in a memory cell (i.e., the memory cell comprises a three bit per cell multi-level cell).

In step 980, a second data value is determined based on at least a portion of the second set of ECC parity. The second data value may correspond with a parity bit of a parity page associated with the one or more data pages.

In step 982, it is determined whether the target programming state is the highest programming state within a voltage window. If it is determined that the target programming state corresponds with the highest programming state, then step 984 is performed. Otherwise, if it is determined that the target programming state is not the highest programming state, then step 986 is performed. In step 984, a memory cell is programmed to a substate of the highest programming state based on the second data value. In one embodiment, the highest programming state may comprise the highest threshold voltage distribution of eight possible threshold voltage distributions (e.g., the G-state of FIG. 10B). The highest programming state may be associated with two substates. The two substates may include a first substate of the highest programming state corresponding with a second data value equal to "1" and a second substate of the highest programming state corresponding with a second data value equal to "0."

In one embodiment, a memory cell being programmed using foggy-fine programming may be programmed to state GR by using an additional verify level for state GR during the fine stage (or during both the foggy and fine stages of foggy-fine programming). In some embodiments, the ninth verify level for state GR may be omitted. In this case, state GR may be programmed in the open loop, without verifying the ninth verify level (e.g., by preventing memory cells that are intended for the state GR from being inhibited). Open loop programming, however, may lead to over programming issues with the memory cell.

In another embodiment, a target memory cell being programmed using foggy-fine programming may be programmed to state GR by first verifying a neighboring memory cell (e.g., a neighboring memory cell associated with a next word line) during a foggy stage at a verify level that is lower than a conventional verify level by a particular amount, performing fine stage programming on the target memory cell, and then performing fine stage programming on the neighboring memory cell. The particular amount may be determined such that when the neighboring memory cell is programmed to its final state during its fine programming stage, it will cause the target memory cell being programmed to move from state G to state GR.

In step 986, a memory cell is programmed to the target programming state. In this case, the target programming state comprises a middle programming state within the voltage window of the memory cell. The memory cell may be programmed to the target programming state using an incremental programming technique, such as foggy-fine programming.

Figure 12A:
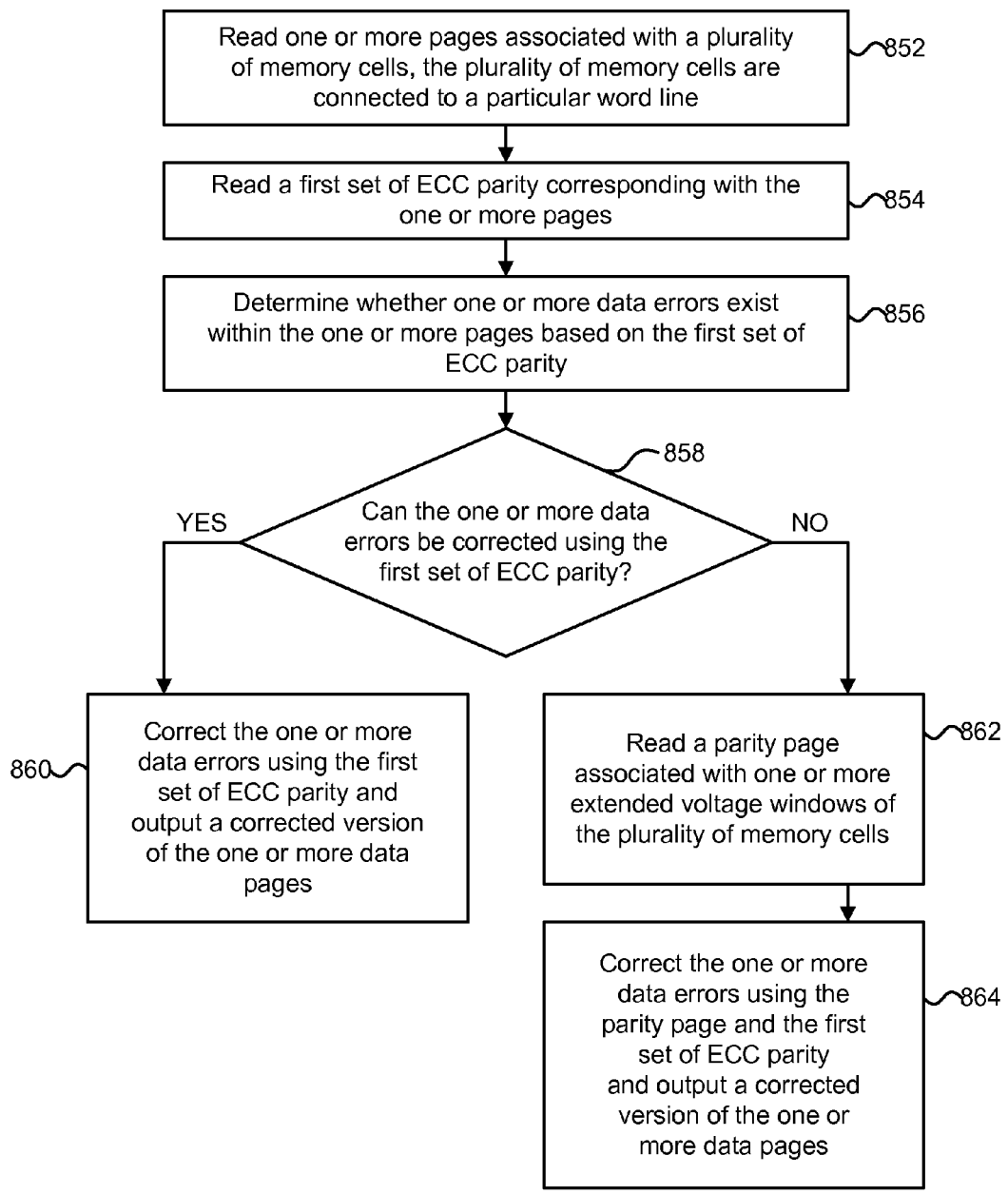
FIG. 12A is a flowchart describing one embodiment of a process for sensing information stored within an extended threshold voltage window of a memory cell.

FIG. 12A is a flowchart describing one embodiment of a process for sensing information stored within an extended threshold voltage window of a memory cell. In one embodiment, the process of FIG. 12A may be performed by a non-volatile storage system, such as non-volatile storage system 596 in FIG. 5.

In step 852, one or more pages associated with a plurality of memory cells are read. The plurality of memory cells may be connected to a particular word line. In step 854, a first set of ECC information corresponding with the one or more pages are read. In one embodiment, the first set of ECC information may be stored in memory cells connected to the particular word line. In step 856, it is determined whether one or more data errors exist within the one or more pages based on the first set of ECC information.

In step 858, it is determined whether the one or more data errors can be corrected using the first set of ECC parity. If the one or more data errors can be corrected using the first set of ECC parity, then step 860 is performed. In step 860, the one or more data errors are corrected using the first set of ECC parity and a corrected version of the one or more data pages is outputted. If the one or more data errors cannot be corrected using the first set of ECC parity, then step 862 is performed. In step 862, a parity page associated with one or more extended voltage windows of the plurality of memory cells is read. One embodiment of a process for sensing information within an extended voltage window of a memory cell is described later in reference to FIG. 12B. In step 864, the one or more data errors are corrected using the extra parity page and the first set of ECC parity and a corrected version of the one or more data pages is outputted. In this case, the extra parity page may boost the error correction capability of a non-volatile storage system.

In one embodiment, if the decoding of a particular data page (or logical page) associated with a particular word line fails, then an extra parity page associated with one or more extended threshold voltage windows may be read. In one example, the extra parity page may be generated by sensing between state G and state GR of FIG. 10B. Reliability values may be assigned to each bit of the extra parity page by sensing the lower-middle (LM) page of a next word line (e.g., WLn+1) adjacent to the particular word line (WLn). In one example, if the LM bit of a neighboring memory cell is "0," then the extra parity bit may be deemed reliable (i.e., the neighboring memory cell was programmed to a high programming state and therefore had the opportunity to reach state GR). Otherwise, if the LM bit of the neighboring memory cell is "1," then the extra parity bit may be deemed unreliable. In some cases, each reliability value corresponding with a particular bit of the extra parity page may be determined by considering more than one neighboring memory cell (e.g., four adjacent memory cells may be considered).

In some cases, each reliability value corresponding with a particular bit of the extra parity page may be determined using a finer reading resolution of the neighboring cell or cells, e.g., based on the read threshold voltage or the read state of the neighboring cell or cells and not only based on their LM bit (e.g., based on whether they are programmed to the lower or upper part of the voltage window). In some cases, each reliability value corresponding with a particular bit of the extra parity page may also be determined using a finer reading resolution of the extra parity page itself (e.g., a finer reading resolution of the cells storing the extra parity page). In one example, the extra parity page bit reliabilities may be generated based on sensing at more than one threshold voltage between state G and state GR of FIG. 10B to determine how close the threshold voltage of the read cell is to the transition point between states G and GR.

In one embodiment, if the extra parity page (P) was generated as an XOR of multiple extra parity pages of the multiple data pages (i.e., P=PL XOR PM XOR PU), then the extra parity page of the particular data page which failed decoding may be generated by XORing the read extra parity page with the encoded extra parity pages of data pages which were decoded successfully. In one example, if the lower and middle pages decoded successfully and the upper data page failed decoding, then the extra parity pages of the lower and middle pages (PL and PM) may be computed based on encoding of the successfully decoded lower and middle data pages and the extra parity page of the upper data page which failed decoding may be computed as PU=PL XOR PM XOR P, where P is the read extra parity page. In some cases, the bits of the extra parity page PU may be assigned with reliabilities according to the reliabilities of the read extra parity page P and may be based on the reliabilities of the pages PL and PM. This may be done by replacing the XOR operation by a "soft XOR" operation as done in soft decoding of parity check codes (e.g., as part of LDPC decoding). In some cases, if the extra parity page is generated as a repetition of multiple copies of a set of parity bits, then the set of parity bits may be decoded by performing a majority vote of corresponding multiple copies of the particular parity bit. If the parity bits are assigned with reliabilities, the majority vote can take the reliabilities into account. In one example, if the parity bits and their assigned reliabilities are represented using log-likelihood ratios (LLRs), then each parity bit in the set of parity bits may be decoded by summing up the LLR values of its multiple copies.

Figure 12B:
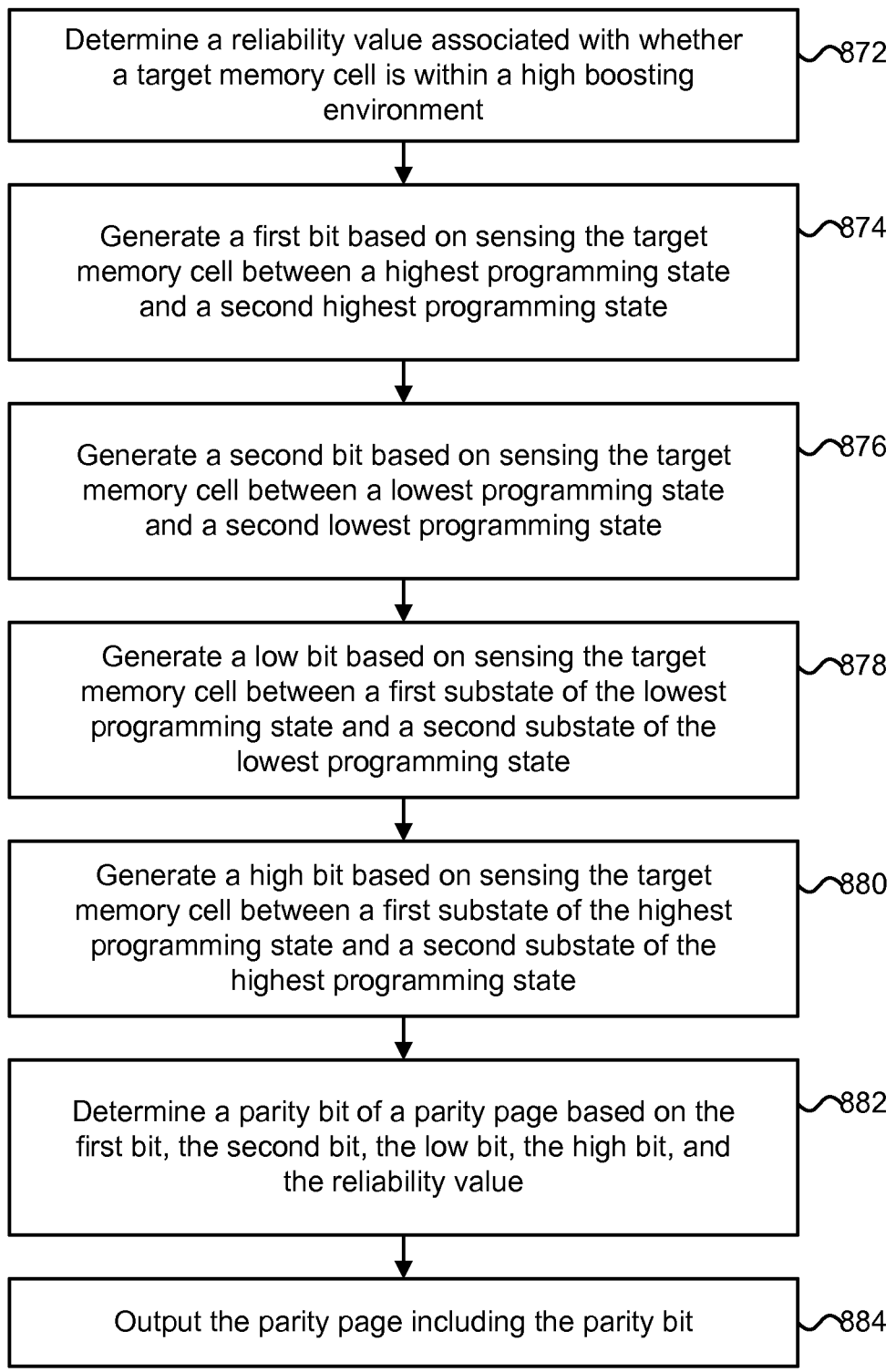
FIG. 12B is a flowchart describing one embodiment of a process for sensing information within an extended voltage window of a memory cell.

FIG. 12B is a flowchart describing one embodiment of a process for sensing information within an extended voltage window of a memory cell. The process described in FIG. 12B is one example of a process for implementing step 862 in FIG. 12A. In one embodiment, the process of FIG. 12B may be performed by a non-volatile storage system, such as non-volatile storage system 596 in FIG. 5.

In step 872, a reliability value associated with whether a target memory cell is within a high boosting environment is determined. The reliability value may comprise a probability value or a degree of confidence value that the memory cell is within the high boosting environment. The reliability value indicates whether the cell was able to reliably embed extra information (e.g. an extra parity bit) within the extended window part, as a function of the boosting level it experienced during its programming. In some embodiments, the reliability value may be generated by sensing programming states associated with one or more neighboring memory cells adjacent to the target memory cell. In one example, a neighboring memory cell of the target memory cell corresponding with a next word line (e.g., word line WLn+1) may be sensed and an LM bit (or lower-middle bit) may be generated corresponding with whether the neighboring memory cell has been programmed to the upper half of a voltage window or the lower half of the voltage window (e.g., by sensing between states C and D in FIG. 10B). In another example, one or more neighboring data values associated with one or more neighboring memory cells adjacent to the memory cell may be sensed and a weighted average based on coupling ratios may be computed to determine the reliability value. In some cases, a determination of the actual programming state of each of the one or more neighboring memory cells may be used to determine the reliability value (e.g., via high resolution sensing).

In step 874, a first bit is generated based on sensing the target memory cell between a highest programming state and a second highest programming state. In one example, the first bit may be generated by sensing between state F and state G in FIG. 10B. In step 876, a second bit is generated based on sensing the target memory cell between a lowest programming state and a second lowest programming state. In one example, the second bit may be generated by sensing between the erased state and state A in FIG. 10B.

In step 878, a low bit is generated based on sensing the target memory cell between a first substate of the lowest programming state and a second substate of the lowest programming state. In one example, the low bit may be generated by sensing between state Er and state ErR in FIG. 10B. In step 880, a high bit is generated based on sensing the target memory cell between a first substate of the highest programming state and a second substate of the highest programming state. In one example, the high bit may be generated by sensing between state G and state GR in FIG. 10B.

Each of the first bit, second bit, low bit and high bit, may also be assigned with a reliability value. This may be done based on a predetermined cell voltage distribution model and/or a higher resolution reading. In one example, in order to associate a reliability value for the first bit, additional sensing operations may be performed between states F and G, in order to determine how close the threshold voltage of the cell is to the boundary point between the voltage bands associated with states F and G. If the threshold voltage of the cell is close to the boundary point, then the first bit may be assigned with a low reliability. If the threshold voltage of the cell is far from the boundary point, then the first bit may be assigned with a high reliability. While the reliability value associated with the boosting level of the environment indicates whether the cell was able to reliably embed extra information (e.g. an extra parity bit) within the extended window part, the reliability values of the first, second, low and high bit indicate the confidence level in determining the value of these bits.

In step 882, a parity bit of a parity page is determined based on the first bit, the second bit, the low bit, the high bit, and the reliability value or values (e.g., if the first bit, the second bit, the low bit, the high bit are also associated with reliability values, besides the reliability value that determines the boosting level of the environment). In one embodiment, the parity bit may be determined as the low bit if the second bit is "1" (indicating that the cell was programmed to the lowest Er state), and may be determined as the high bit if the first bit is "0" (indicating that the cell was programmed to the highest state). A reliability value may be associated with the parity bit as a function of the boosting reliability value and also the reliability values associated with the first, second, low and high bits. In another embodiment, if the reliability value corresponds with a high boosting environment, then the parity bit may be determined based on the first bit and the high bit (i.e., the parity bit is generated based on the two substates of the highest programming state). In another embodiment, if the reliability value corresponds with a low boosting environment, then the parity bit may be determined based on the second bit and the low bit (i.e., the parity bit is generated based on the two substates of the lowest programming state). In step 884, the parity page comprising the parity bits and their possibly associated reliability values, is outputted. The extra parity page may then be used by the ECC decoder for boosting its correction capability and recovering the data.

Figure 13A:
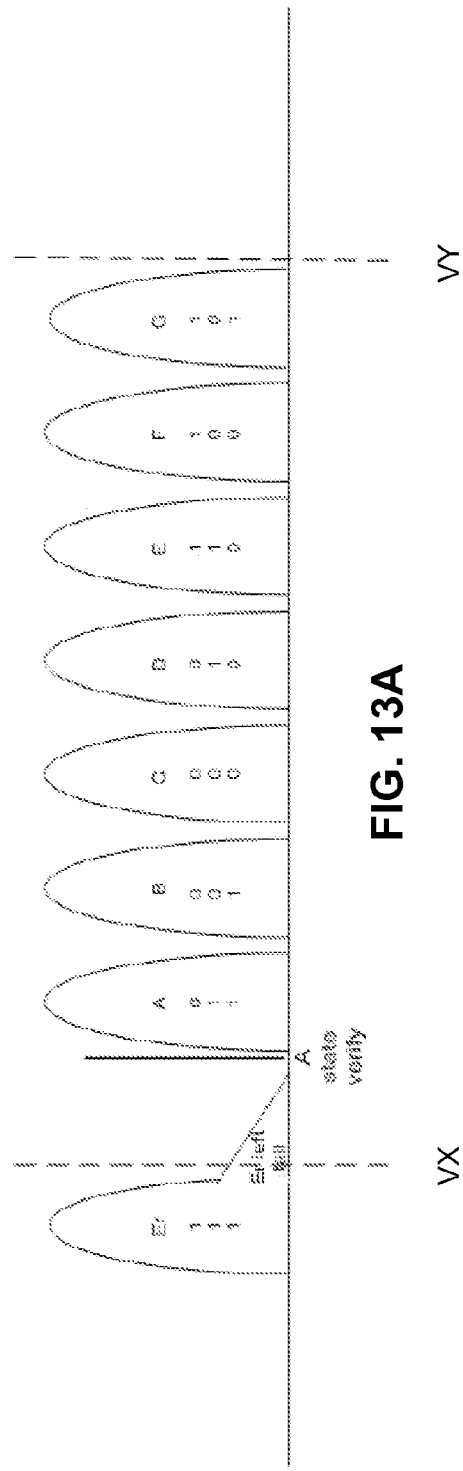
FIG. 13A depicts one embodiment of a conventional threshold voltage window for a memory cell.
Figure 13B:
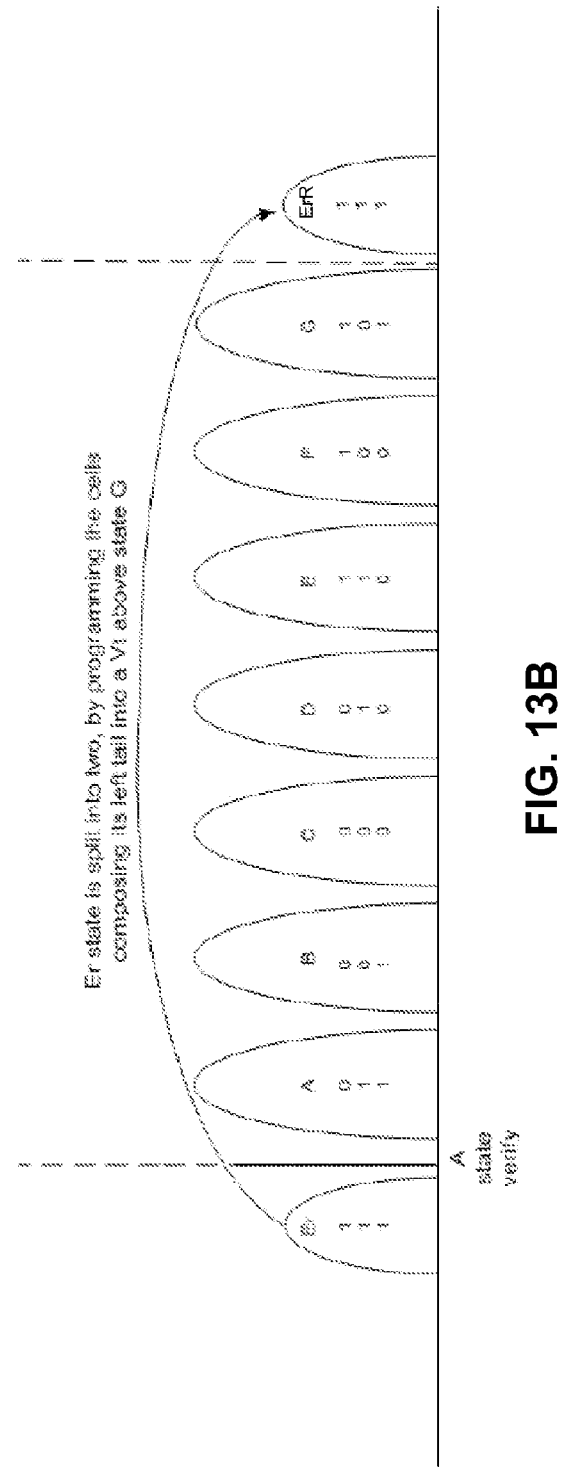
FIG. 13B depicts an alternative embodiment of an extended threshold voltage window for a memory cell.

FIG. 13A depicts one embodiment of a conventional threshold voltage window for a memory cell. Eight distributions corresponding with the erased state and programming states A through G are depicted between voltage VX and voltage VY. The erased state Er includes an Er left tail portion of the distribution between voltage V2 and the A-state verify level. FIG. 13B depicts an alternative embodiment of an extended threshold voltage window for a memory cell. As depicted, the verify level of state A (i.e., the A-state verify level) has been shifted to the left to a lower threshold voltage (e.g., shifted to the left by 300 mV) and the voltage threshold distributions for states A through G have been correspondingly widened within the expanded voltage window. In this case, lower error rates may be exhibited for states A through G and therefore less redundancy may be used and higher memory density may be achieved. Alternatively, more write/erase cycles and/or better data retention and/or higher programming speed can be obtained using the same redundancy. This benefit, however, comes at the expense of an additional verify level during programming and an extra sensing during read in order to distinguish between state G and state ErR. As the A-state verify level has been shifted to the left, the Er left tail portion of the erased state distribution must be moved in order to distinguish between the erased state and state A. This may be accomplished by splitting the erased state into state Er and state ErR and programming the memory cells associated the Er left tail to the ErR substate. Many of the memory cells associated with the Er left tail may be programmed to substate ErR as those memory cells may be largely composed of memory cells within a high boosting environment.

In one embodiment, two or more threshold distributions may map to the same programming state. In one example, a first threshold distribution below the main voltage window and a second threshold distribution above the main voltage window may both correspond with a particular programming state (e.g., the erased state). The two or more threshold distributions may be separated by one or more other threshold distributions associated with one or more other programming states. In some cases, when a cell is to be programmed into a programming state that is mapped into more than one threshold distribution, then determining the threshold voltage into which the cell is programmed may be done as a function of the boosting condition imposed on the memory cell by other memory cells (e.g., via coupling from neighboring memory cells). In one example, if the cell is designated for the erased state and is expected to have a low boosting environment, then the cell may be programmed into the lower threshold voltage distribution associated with the erased state (Er). However, if the cell is designated for the erased state and is expected to have a high boosting environment, then the cell may be programmed into the upper threshold voltage distribution associated with the erased state (ErR).

One embodiment of the disclosed technology includes determining a reliability value associated with whether a target memory cell is within a high boosting environment, generating a first bit based on sensing the target memory cell between a highest programming state of a plurality of programming states and a second highest programming state of the plurality of programming states, generating a high bit based on sensing the target memory cell between a first substate of the highest programming state and a second substate of the highest programming state, and determining a stored data value based on the first bit, the high bit, and the reliability value.

One embodiment of the disclosed technology includes acquiring one or more data pages, acquiring one or more additional data values, determining a first target programming state of a plurality of programming states corresponding with a first portion of the one or more data pages, determining a first data value of the one or more additional data values, determining whether the first target programming state corresponds with a highest programming state of the plurality of programming states, and programming a memory cell to a substate of the highest programming state based on the first data value in response to determining that the first target programming state corresponds with the highest programming state.

One embodiment of the disclosed technology includes a semiconductor memory array and one or more managing circuits in communication with the semiconductor memory array. The semiconductor memory array includes a target memory cell. The one or more managing circuits determine a reliability value associated with whether the target memory cell is within a high boosting environment, perform a first sensing of the target memory cell between a highest programming state of a plurality of programming states and a second highest programming state of the plurality of programming states, perform a second sensing of the target memory cell between a first substate of the highest programming state and a second substate of the highest programming state, and determine a stored data value based on the first sensing, the second sensing, and the reliability value.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" are used to described different embodiments and do not necessarily refer to the same embodiment.

For purposes of this document, a connection can be a direct connection or an indirect connection (e.g., via another part).

For purposes of this document, the term "set" of objects, refers to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for reading data from a non-volatile storage system, comprising:
   determining whether a target memory cell is within a high boosting environment;
   determining whether the target memory cell is programmed into a highest programming state of a plurality of programming states;
   generating a high bit based on sensing the target memory cell between a first substate of the highest programming state and a second substate of the highest programming state;
   determining a stored data value based on the high bit in response to determining that the target memory cell is within the high boosting environment and that the target memory cell is programmed into the highest programming state; and
   outputting the stored data value.

2. The method of claim 1, further comprising:
   determining whether the target memory cell is programmed into a lowest programming state of the plurality of programming states;
   generating a low bit based on sensing the target memory cell between a first substate of the lowest programming state and a second substate of the lowest programming state; and
   the determining a stored data value includes determining the stored data value based on the low bit in response to determining that the target memory cell is not within the high boosting environment and that the target memory cell is programmed into the lowest programming state.

3. The method of claim 1, wherein:
   the determining whether a target memory cell is within a high boosting environment includes sensing one or more neighboring data values from one or more neighboring memory cells adjacent to the target memory cell.

4. The method of claim 1, wherein:
   the determining whether a target memory cell is within a high boosting environment includes determining whether a neighboring memory cell of the target memory cell has been programmed to a programming state corresponding with an upper portion of a threshold voltage window.

5. The method of claim 1, wherein:
   the determining whether a target memory cell is within a high boosting environment includes sensing one or more neighboring data values associated with one or more neighboring memory cells of the target memory cell and determining a weighted average of the one or more neighboring data values based on coupling ratios associated with each of the one or more neighboring memory cells.

6. The method of claim 1, wherein:
   the determining whether a target memory cell is within a high boosting environment includes determining a programming state of a neighboring memory cell adjacent to the target memory cell.

7. The method of claim 2, wherein:
   the target memory cell comprises a multi-level memory cell; and
   the lowest programming state comprises an erased state.

8. The method of claim 1, wherein:
   the determining whether the target memory cell is programmed into a highest programming state includes sensing the target memory cell between the highest programming state of the plurality of programming states and a second highest programming state of the plurality of programming states.

9. A method for writing data to a non-volatile storage system, comprising:
   acquiring one or more data pages;
   acquiring one or more additional data values;
   determining a first target programming state of a plurality of programming states corresponding with a first portion of the one or more data pages;
   determining a first data value of the one or more additional data values;
   determining whether the first target programming state corresponds with a highest programming state of the plurality of programming states; and
   programming a memory cell to a substate of the highest programming state based on the first data value in response to determining that the first target programming state corresponds with the highest programming state, the substate of the highest programming state resides outside of an intrinsic threshold voltage window of the memory cell.

10. The method of claim 9, wherein:
the one or more data pages include a first page;
the intrinsic threshold voltage window comprises a range of threshold voltages into which the memory cell may be programmed given that each neighboring memory cell adjacent to the memory cell is programmed to a lowest programming state of the plurality of programming states;
the one or more additional data values comprise ECC information associated with the first page;
the plurality of programming states corresponds with a plurality of threshold voltage distributions associated with the memory cell; and
the first portion includes a first bit of the first page.

11. The method of claim 9, further comprising:
determining a second target programming state of the plurality of programming states corresponding with a second portion of the one or more data pages, the second portion is different from the first portion;
determining a second data value of the one or more additional data values;
determining whether the second target programming state corresponds with a lowest programming state of the plurality of programming states; and
programming a second memory cell to a substate of the lowest programming state based on the second data value in response to determining that the second target programming state corresponds with the lowest programming state.

12. The method of claim 9, wherein:
the programming a memory cell includes performing foggy-fine programming.

13. The method of claim 9, wherein:
the programming a memory cell includes programming the memory cell to a highest substate of the highest programming state using open loop programming.

14. The method of claim 9, wherein:
the first data value comprises error correction information associated with each of the one or more data pages.

15. The method of claim 9, wherein:
the one or more additional data values include redundant parity bits.

16. The method of claim 9, wherein:
the memory cell comprises a multi-level memory cell.

17. A non-volatile storage system, comprising:
a semiconductor memory array, the semiconductor memory array includes a target memory cell; and
one or more managing circuits in communication with the semiconductor memory array, the one or more managing circuits configured to determine whether the target memory cell is within a high boosting environment, the one or more managing circuits configured to determine whether the target memory cell is programmed into a highest programming state of a plurality of programming states, the one or more managing circuits configured to perform a second sensing of the target memory cell between a first substate of the highest programming state and a second substate of the highest programming state, the one or more managing circuits configured to determine a stored data value based on the second sensing if the target memory cell is determined to be within the high boosting environment and the target memory cell is determined to be programmed into the highest programming state.

18. The non-volatile storage system of claim 17, wherein:
the one or more managing circuits configured to sense one or more neighboring data values from one or more neighboring memory cells of the target memory cell, the one or more managing circuits configured to determine whether the target memory cell is within the high boosting environment based on the one or more neighboring data values.

19. The non-volatile storage system of claim 17, wherein:
the one or more managing circuits configured to sense one or more neighboring data values associated with one or more neighboring memory cells of the target memory cell, the one or more managing circuit configured to determine a weighted average of the one or more neighboring data values based on coupling ratios associated with each of the one or more neighboring memory cells.

20. The non-volatile storage system of claim 18, wherein:
the target memory cell comprises a multi-level memory cell; and
the stored data value comprises error correction information.

21. A method for reading data from a non-volatile storage system, comprising:
determining whether a target memory cell is within a low boosting environment;
determining whether the target memory cell is programmed into a lowest programming state of a plurality of programming states;
generating a low bit based on sensing the target memory cell between a first substate of the lowest programming state and a second substate of the lowest programming state;
determining a stored data value based on the low bit in response to determining that the target memory cell is within the low boosting environment and that the target memory cell is programmed into the lowest programming state; and
outputting the stored data value.

22. The method of claim 21, wherein:
the determining whether a target memory cell is within a low boosting includes sensing one or more neighboring data values from one or more neighboring memory cells adjacent to the target memory cell.

23. The method of claim 21, wherein:
the determining whether a target memory cell is within a low boosting environment includes determining whether a neighboring memory cell of the target memory cell has been programmed to a programming state corresponding with a lower portion of a threshold voltage window.

24. The method of claim 21, wherein:
the determining whether a target memory cell is within a low boosting environment includes sensing one or more neighboring data values associated with one or more neighboring memory cells of the target memory cell and determining a weighted average of the one or more neighboring data values based on coupling ratios associated with each of the one or more neighboring memory cells.

25. The method of claim 21, wherein:
the determining whether a target memory cell is within a low boosting environment includes determining a programming state of a neighboring memory cell adjacent to the target memory cell.

26. The method of claim 21, wherein:
the target memory cell comprises a multi-level memory cell; and
the lowest programming state comprises an erased state.

* * * * *